US008391065B2

(12) United States Patent
Noguchi

(10) Patent No.: US 8,391,065 B2
(45) Date of Patent: Mar. 5, 2013

(54) SEMICONDUCTOR MEMORY DEVICE REDUCING RESISTANCE FLUCTUATION OF DATA TRANSFER LINE

(75) Inventor: Mitsuhiro Noguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 12/877,563

(22) Filed: Sep. 8, 2010

(65) Prior Publication Data
US 2011/0096600 A1    Apr. 28, 2011

(30) Foreign Application Priority Data

Oct. 26, 2009 (JP) ................... 2009-245334

(51) Int. Cl.
*G11C 16/04* (2006.01)
*H01L 23/48* (2006.01)

(52) U.S. Cl. ......... 365/185.05; 365/230.03; 365/230.06; 257/773; 257/775

(58) Field of Classification Search ............. 365/185.05, 365/230.03, 230.06; 257/773, 775
See application file for complete search history.

(56) References Cited

U.S. PATENT DOCUMENTS

| | | | |
|---|---|---|---|
| 6,339,817 B1 * | 1/2002 | Maesako et al. | 711/165 |
| 6,791,132 B2 * | 9/2004 | Nakai et al. | 257/296 |
| 7,248,495 B2 * | 7/2007 | Arimoto et al. | 365/149 |
| 7,259,464 B1 * | 8/2007 | Batra | 257/776 |
| 7,332,762 B2 * | 2/2008 | Watanabe et al. | 257/296 |
| 7,721,239 B2 | 5/2010 | Kato et al. | |
| 2009/0057814 A1 | 3/2009 | Izumi et al. | |
| 2011/0228583 A1 * | 9/2011 | Noguchi et al. | 365/63 |

FOREIGN PATENT DOCUMENTS

| | | |
|---|---|---|
| JP | 2002-151601 | 5/2002 |
| JP | 3411129 | 3/2003 |
| JP | 2005-228372 | 8/2005 |
| JP | 2007-194496 | 8/2007 |
| KR | 10-0280912 | 3/2001 |

OTHER PUBLICATIONS

Korean Office Action issued Oct. 28, 2011, in Patent Application No. 10-2010-0088287 (with English-language translation).

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

According to one embodiment, a semiconductor memory device includes first and second memory cell blocks and an interconnect rerouting unit provided therebetween. The first memory cell block includes first interconnects and second interconnects provided in each space between the first interconnects. The second memory cell block includes a plurality of third interconnects provided on lines extending from the first interconnects and a plurality of fourth interconnects provided on lines extending from the second interconnects. A width and a thickness of the second and fourth interconnects are smaller than a width and a thickness of the first and second interconnects. Each of the first to fourth interconnects is connected to one end of first to fourth cell units including memory cells. The interconnect rerouting unit connects one of the fourth interconnects to one of the first interconnects and connects one of the third interconnects to the second interconnects.

20 Claims, 15 Drawing Sheets

SEMICONDUCTOR MEMORY DEVICE REDUCING RESISTANCE FLUCTUATION OF DATA TRANSFER LINE

CROSS-REFERENCE TO RELATED APPLICATIONS

This application is based upon and claims the benefit of priority from the prior Japanese Patent Application No. 2009-245334, filed on Oct. 26, 2009; the entire contents of which are incorporated herein by reference.

FIELD

Embodiments described herein relate generally to a semiconductor memory device reducing resistance fluctuation of data transfer line.

BACKGROUND

Methods for high integration of semiconductor memory devices (memory) include a method of using sidewall patterning technology to form a data transfer line connected to a memory cell such that the width of the data transfer line is half the minimum dimension of the lithography. However, in such a method, the fluctuation of the width of the mask pattern of the lithography may cause, for example, a wide interconnect width and a narrow interconnect width to occur alternately in adjacent interconnects. Therefore, the interconnect resistance undesirably fluctuates between the interconnects.

Particularly for interconnects having narrow interconnect widths, the read-out speed decreases and the read-out margin decreases as the interconnect delay of the electrical signal increases. As the interconnect resistance increases, electromigration and stress induced migration occur easily; and the reliability of the semiconductor memory device deteriorates.

Although JP-A 2007-194496 (Kokai) discusses a layout regarding contacts between draw out lines and conductive lines having lines and spaces to increase the memory capacity and the reliability, the fluctuation of the interconnect resistance between the interconnects is not mentioned, and there is room for improvement.

DETAILED DESCRIPTION

Figure 1:
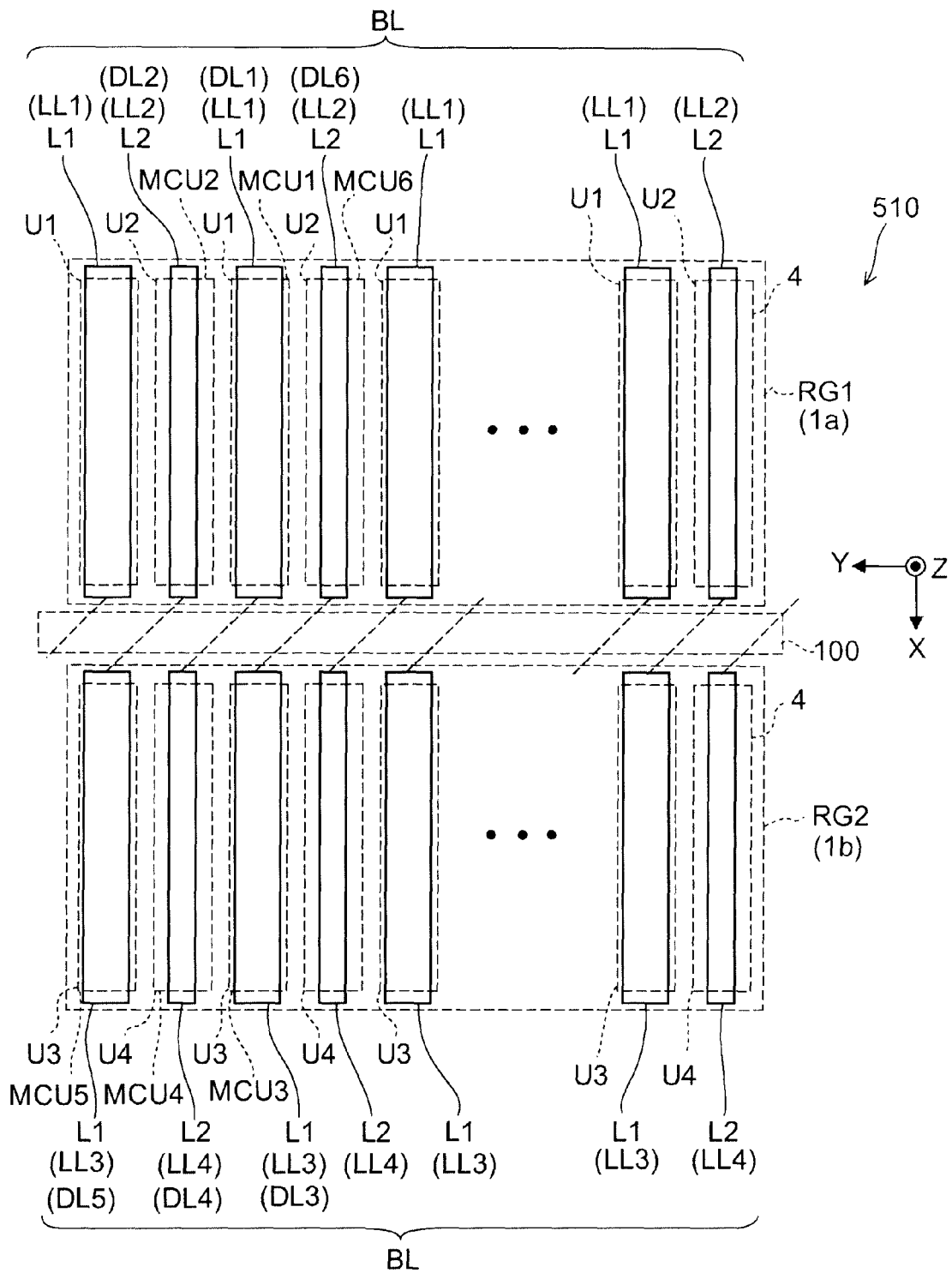
FIG. 1 is a schematic view illustrating the configuration of a semiconductor memory device according to a first embodiment.

In general, according to one embodiment, a semiconductor memory device includes a first memory cell block, a second memory cell block adjacent to the first memory cell block in a first direction and an interconnect rerouting unit provided between the first memory cell block and the second memory cell block. The first memory cell block includes a plurality of first cell units, a plurality of second cell units, a plurality of first interconnects and a plurality of second interconnects. Each of the plurality of first cell units includes a plurality of memory cells and each of the plurality of second cell units includes a plurality of memory cells. Each of the plurality of first interconnects is aligned in the first direction and connected to one end of each of the first cell units respectively. Each of the plurality of second interconnects is aligned in the first direction in each space between the first interconnects and connected to one end of each of the second cell units respectively. Each of the plurality of second interconnects have at least one of a width of each of the plurality of second interconnects along a second direction perpendicular to the first direction being smaller than a width of each of the plurality of first interconnects along the second direction and a thickness of each of the plurality of second interconnects along a third direction perpendicular to the first direction and the second direction being smaller than a thickness of each of the plurality of first interconnects along the third direction. The second memory cell block includes a plurality of third cell units, a plurality of fourth cell units, a plurality of third interconnects and a plurality of fourth interconnect. Each of the plurality of third cell units includes a plurality of memory cells. Each of plurality of fourth cell units includes a plurality of memory cells. Each of the plurality of third interconnects is aligned in the first direction on a line extending from the first interconnect in the first direction and connected to one end of each of the third cell units respectively. Each of the plurality of fourth interconnects is aligned in the first direction on a line extending from the second interconnect in the first direction and connected to one end of each of the fourth cell units respectively. Each of the plurality of fourth interconnects have at least one of a width of each of the plurality of fourth interconnects along the second direction being smaller than a width of each of the plurality of third interconnects along the second direction and a thickness of each of the plurality of fourth interconnects along the third direction being smaller than a thickness of each of the plurality of third interconnects along the third direction. The interconnect rerouting unit electrically connects one of the plurality of fourth interconnects to one of the plurality of first interconnects and electrically connects one of the plurality of third interconnects to one of the plurality of second interconnects.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic view illustrating the configuration of a semiconductor memory device according to a first embodiment.

As illustrated in FIG. 1, the semiconductor memory device 510 according to this embodiment includes first to fourth data transfer lines DL1 to DL4.

In the semiconductor memory device 510, a first region RG1 and a second region RG2 are provided on a major surface of a substrate (not illustrated) on which the semiconductor memory device 510 is provided. The first region RG1 is a region where a first memory cell block 1a described below is provided; and the second region RG2 is a region where a second memory cell block 1b described below is provided.

Each of the first to fourth data transfer lines DL1 to DL4 is connected to one end of a memory cell unit 4 (first to fourth memory cell units MCU1 to MCU4) which includes multiple memory cells.

Here, a direction perpendicular to the major surface of the substrate is taken as a Z axis direction (the third direction). One direction perpendicular to the Z axis direction is taken as an X axis direction (the first direction). A direction perpendicular to the Z axis direction and the X axis direction is taken as a Y axis direction (the second direction).

The first region RG1 and the second region RG2 are adjacent in the X axis direction.

Each of the first to fourth data transfer lines DL1 to DL4 is aligned in the X axis direction.

The first and second data transfer lines DL1 and DL2 are provided in the first region RG1; and the third and fourth data transfer lines DL3 and DL4 are provided in the second region RG2.

The first data transfer line DL1 and the third data transfer line DL3 are adjacent in the X axis direction; and the third data transfer line DL3 is provided on a line extending from the first data transfer line DL1 in the X axis direction. The second data transfer line DL2 and the fourth data transfer line DL4 are adjacent in the X axis direction; and the fourth data transfer line DL4 is provided on a line extending from the second data transfer line DL2 in the X axis direction. In other words, in the X-Y plane, the fourth data transfer line DL4 is positioned in a diagonal direction from the first data transfer line DL1.

The first to fourth data transfer lines DL1 to DL4 are formed by, for example, sidewall patterning. Sidewall patterning is described below. The widths and thicknesses of the first to fourth data transfer lines DL1 to DL4 have mutually different values due to fluctuations of the sidewall patterning.

Herein, width is taken to be the length along the Y axis direction. For example, while the semiconductor memory device 510 is provided on the major surface of the substrate, the widths of the first to fourth data transfer lines DL1 to DL4 may be taken as, for example, the widths of the first to fourth data transfer lines DL1 to DL4 on the upper face (the face on the side opposite to the substrate). Thickness is the length along the Z axis direction.

The width of the second data transfer line DL2 along the Y axis direction is narrower than the width of the first data transfer line DL1 along the Y axis direction. The thickness of the second data transfer line DL2 along the Z axis direction is thinner than the thickness of the first data transfer line DL1 along the Z axis direction.

Here, at least one selected from the width and the thickness of the first data transfer line DL1 may be greater than that of the second data transfer line DL2. Also, at least one selected from the width and the thickness of the third data transfer line DL3 may be greater than that of the fourth data transfer line DL4.

The width and the thickness of the third data transfer line DL3 may be substantially the same as those of the first data transfer line DL1; and the width and the thickness of the fourth data transfer line DL4 may be substantially the same as those of the second data transfer line DL2.

For example, the depth of the first data transfer line DL1 is deeper than the depth of the second data transfer line DL2. Also, the depth of the third data transfer line DL3 is deeper than the depth of the fourth data transfer line DL4. Herein, depth is the length along the Z axis direction from the upper face to the lower face of the data transfer line.

The electrical resistance of the second data transfer line DL2 is higher than that of the first data transfer line DL1; and the electrical resistance of the fourth data transfer line DL4 is higher than that of the third data transfer line DL3. Herein, the electrical resistances of the first to fourth data transfer lines DL1 to DL4 are the resistances along the X axis direction, i.e., the so-called interconnect resistance.

In other words, in the semiconductor memory device 510 as illustrated in FIG. 1, a low resistance interconnect L1, which has a low interconnect resistance, is arranged alternately in the Y axis direction with a high resistance interconnect L2, which has an interconnect resistance higher than that of the low resistance interconnect L1.

Thus, the semiconductor memory device 510 includes: multiple first interconnects LL1 (the low resistance interconnects L1 of the first region RG1) provided in the first region RG1; second interconnects LL2 (the high resistance interconnects L2 of the first region RG1) provided in the first region RG1 in each space between the first interconnects LL1, where the second interconnect LL2 has an electrical resistance higher than that of the first interconnect LL1; multiple third interconnects LL3 (the low resistance interconnects L1 of the second region RG2) provided in the second region RG2 adjacent to the first region RG1 in the X axis direction to align in the X axis direction on lines extending from the first interconnects LL1; and fourth interconnects LL4 (the high resistance interconnects L2 of the second region RG2) provided in the second region RG2 to align in the X axis direction on lines extending from the second interconnects LL2, where the fourth interconnect LL4 has an electrical resistance higher than that of the third interconnect LL3. Each of the first to fourth interconnects LL1 to LL4 is connected to one end of each of the multiple memory cell units 4 respectively, where each of the multiple memory cell units 4 includes multiple memory cells. The multiple first interconnects LL1 and the multiple second interconnects LL2 are arranged alternately in the Y axis direction. The multiple third interconnects LL3 and the multiple fourth interconnects LL4 are arranged alternately in the Y axis direction.

At least one selected from the width along the Y axis direction and the thickness along the Z axis direction of the second interconnect LL2 is smaller than that of the first interconnect LL1. At least one selected from the width along the Y axis direction and the thickness along the Z axis direction of the fourth interconnect LL4 is smaller than that of the third interconnect LL3.

One of the fourth interconnects LL4 is electrically connected to one of the first interconnects LL1 between the first region RG1 and the second region RG2; and one of the third interconnects LL3 is electrically connected to one of the second interconnects LL2 between the first region RG1 and the second region RG2.

In other words, the semiconductor memory device 510 according to this embodiment includes the first memory cell block 1a, the second memory cell block 1b adjacent to the first memory cell block 1a in the X axis direction, and a data transfer line rerouting unit 100 (the interconnect rerouting unit) provided between the first memory cell block 1a and the second memory cell block 1b.

The first memory cell block 1a includes multiple first cell units U1, multiple second cell units U2, the multiple first interconnects LL1, and the multiple second interconnects LL2. Each of the multiple first cell units U1 includes multiple memory cells; and each of the multiple second cell units U2 includes multiple memory cells.

Each of the multiple first interconnects LL1 is connected to one end of each of the first cell units U1, respectively.

Each of the multiple second interconnects LL2 is aligned in each space between the first interconnects LL1 to connect to one end of each of the second cell units U2, respectively. The second interconnect LL2 has an electrical resistance higher than that of the first interconnect LL1.

The second memory cell block 1b includes multiple third cell units U3, multiple fourth cell units U4, the multiple third interconnects LL3, and the multiple fourth interconnects LL4. Each of the multiple third cell units U3 includes multiple memory cells; and each of the multiple fourth cell units U4 includes multiple memory cells.

Each of the multiple third interconnects LL3 is aligned in the X axis direction on a line extending from the first interconnect LL1 in the X axis direction to connect to one end of each of the third cell units U3, respectively.

Each of the multiple fourth interconnects LL4 is aligned in the X axis direction on a line extending from the second interconnect LL2 in the X axis direction to connect to one end of each of the fourth cell units U4, respectively. The fourth interconnect LL4 has an electrical resistance higher than that of the third interconnect LL3.

The data transfer line rerouting unit 100 electrically connects the one of the fourth interconnects LL4 to the one of the first interconnects LL1 and electrically connects the one of the third interconnects LL3 to the one of the second interconnects LL2.

The multiple memory cells MC recited above are arranged along the X axis direction. Each of the multiple first to fourth cell units U1 to U4 recited above is aligned in the X axis direction. The multiple first and second cell units U1 and U2 recited above are arranged alternately along the Y axis direction. The multiple third and fourth cell units U3 and U4 recited above are arrange alternately along the Y axis direction.

One of the first cell units U1 is the memory cell unit MCU1 connected to the first data transfer line DL1. One of the second cell units U2 is the second memory cell unit MCU2 connected to the second data transfer line DL2. One of the third cell units U3 is the third memory cell unit MCU3 connected to the third data transfer line DL3. One of the fourth cell units U4 is the fourth memory cell unit MCU4 connected to the fourth data transfer line DL4. One of the third cell units U3 is a fifth memory cell unit MCU5 connected to a fifth data transfer line DL5 described below. One of the second cell units U2 is a sixth memory cell unit MCU6 connected to a sixth data transfer line DL6 described below.

For example, for one of the sets of the low resistance interconnect L1 and the high resistance interconnect L2 adjacent thereto in the first region RG1, the low resistance interconnect L1 may be taken to be the first data transfer line DL1; and the high resistance interconnect L2 may be taken to be the second data transfer line DL2. For one of the sets of the low resistance interconnect L1 and the high resistance interconnect L2 adjacent thereto in the second region RG2, the low resistance interconnect L1 adjacent to the first data transfer line DL1 in the X axis direction may be taken to be the third data transfer line DL3; and the high resistance interconnect L2 adjacent to the second data transfer line DL2 in the X axis direction may be taken to be the fourth data transfer line DL4.

The data transfer line rerouting unit 100 (the interconnect rerouting unit) between the first region RG1 and the second region RG2 electrically connects, for example, the first data transfer line DL1 to the fourth data transfer line DL4.

In other words, the second data transfer line DL2, which is one of the second interconnects LL2, is adjacent to the first data transfer line DL1, which is one of the first interconnects LL1, in the Y axis direction; the third data transfer line DL3, which is one of the third interconnects LL3, is disposed on a line extending from the first data transfer line DL1 in the X axis direction; the fourth data transfer line DL4, which is one of the fourth interconnects LL4, is disposed on a line extending from the second data transfer line DL2 in the X axis direction; and the fourth data transfer line DL4 is electrically connected to the first data transfer line DL1 between the first region RG1 and the second region RG2.

In other words, the first data transfer line DL1 is electrically connected to the fourth data transfer line DL4 disposed in the diagonal direction as viewed from the first data transfer line DL1.

In this specific example, each of the data transfer lines of the first region RG1 is connected to the data transfer line shifted one line in the Y axis direction in the second region RG2.

Here, the fifth data transfer line DL5 is taken to be the low resistance interconnect L1 adjacent to the fourth data transfer line DL4 on the side of the fourth data transfer line DL4 opposite to the third data transfer line DL3 in the Y axis direction. The sixth data transfer line DL6 is taken to be the high resistance interconnect L2 adjacent to the first data transfer line DL1 on the side of the first data transfer line DL1 opposite to the second data transfer line DL2 in the Y axis direction.

The data line rerouting unit 100 electrically connects the second data transfer line DL2 to the fifth data transfer line DL5 (connected to the one end of the fifth memory cell unit MCU5) of the second region RG2.

The data line rerouting unit 100 electrically connects the third data transfer line DL3 to the sixth data transfer line DL6 (connected to the one end of the sixth memory cell unit MCU6) of the first region RG1.

In other words, the fifth data transfer line DL5, which is one other of the third interconnects LL3, is adjacent to the fourth data transfer line DL4 on the side of the fourth data transfer line DL4 opposite to the third data transfer line DL3 in the Y axis direction. The sixth data transfer line DL6, which is one other of the second interconnects LL2, is adjacent to the first data transfer line DL1 on the side of the first data transfer line DL1 opposite to the second data transfer line DL2 in the Y axis direction. The third data transfer line DL3 is electrically connected to the sixth data transfer line DL6 between the first region RG1 and the second region RG2 while the second data transfer line DL2 is electrically connected to the fifth data transfer line DL5 between the first region RG1 and the second region RG2.

Thus, the semiconductor memory device 510 includes: the first data transfer line DL1 provided in the first region RG1 to connect to one end of the first memory cell unit MCU1 including multiple memory cells; the second data transfer line DL2 provided in the first region RG1 adjacent to the first data transfer line DL1 in the Y axis direction to connect to one end of the second memory cell unit MCU2 including multiple memory cells, where the second data transfer line DL2 has an electrical resistance higher than that of the first data transfer line DL1; the third data transfer line DL3 provided in the second region RG2 to align in the X axis direction on a line extending from the first data transfer line DL1 in the X axis direction and connect to one end of the third memory cell unit MCU3 including multiple memory cells; and the fourth data transfer line DL4 provided in the second region RG2 to align in the X axis direction on a line extending from the second data transfer line DL2 in the X axis direction and connect to one end of the fourth memory cell unit MCU4 including multiple memory cells, where the fourth data transfer line DL4 has an electrical resistance higher than that of the third data transfer line DL3, and the fourth data transfer line DL4 is electrically connected to the first data transfer line DL1 between the first region RG1 and the second region RG2.

By such a configuration, the continuous interconnect of the first data transfer line DL1 and the fourth data transfer line DL4 forms a combination of the low resistance interconnect L1 and the high resistance interconnect L2. Similarly, the continuous interconnect of the second data transfer line DL2 and the fifth data transfer line DL5 forms a combination of the low resistance interconnect L1 and the high resistance interconnect L2. Similarly, the continuous interconnect of the third data transfer line DL3 and the sixth data transfer line DL6 forms a combination of the low resistance interconnect L1 and the high resistance interconnect L2.

Thus, in the semiconductor memory device 510 according to this embodiment, uniform interconnect resistance is provided by connecting the data transfer lines in combinations of the low resistance interconnect L1 and the high resistance interconnect L2; and data transfer lines having high interconnect resistances are eliminated. Thereby, the fluctuation of the electrical resistance of the interconnects can be compensated; the interconnect delay can be suppressed; and the operating speed and the reliability can be improved.

On the other hand, in a semiconductor memory device of a comparative example which does not include the data transfer line rerouting unit 100, the low resistance interconnect L1 is aligned continuously between the first region RG1 and the second region RG2; and the high resistance interconnect L2 also is aligned continuously between the first region RG1 and the second region RG2. In other words, such a configuration corresponds to a configuration in which, for example, the first data transfer line DL1 and the third data transfer line DL3 are connected to each other and the second data transfer line DL2 and the fourth data transfer line DL4 are connected to each other. Therefore, for example, the interconnect delay of the data transfer line of the combination of the second data transfer line DL2 and the fourth data transfer line DL4, which are the high resistance interconnects L2, increases; the operating characteristics deteriorate; and the reliability deteriorates.

Conversely, in the semiconductor memory device 510 according to this embodiment, a configuration is employed in which the data line rerouting unit 100 electrically connects the low resistance interconnect L1 and the high resistance interconnect L2 to each other. Thereby, the interconnect delay can be suppressed; and the operating speed and the reliability can be improved.

The configuration recited above in which the data transfer lines are connected to each other is one example; and the invention is not limited thereto. Various modifications are possible. Specific examples of forms of connecting the data transfer lines to each other, that is, configurations of the data line rerouting unit 100, are described below.

A semiconductor memory device of a first example according to this embodiment will now be described.

First Example

Figure 2:
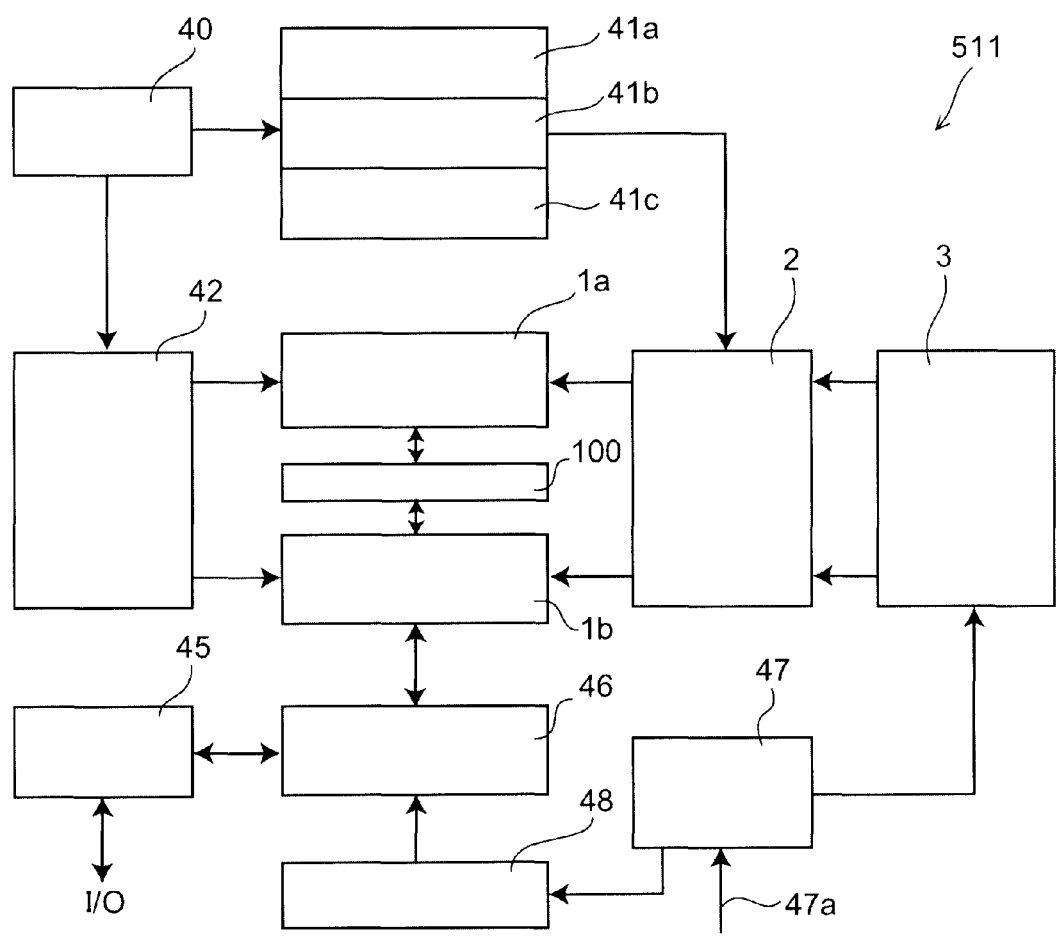
FIG. 2 is a block diagram illustrating the configuration of the semiconductor memory device of the first example.

FIG. 2 is a block diagram illustrating the configuration of the semiconductor memory device of the first example.

The semiconductor memory device 511 according to the first example is a NAND EEPROM.

The first and second memory cell blocks 1a and 1b are provided in the semiconductor memory device 511 as illustrated in FIG. 2. The regions where the first and second memory cell blocks 1a and 1b are provided are the first and second regions RG1 and RG2, respectively. As described below, the memory cell unit 4 is multiply provided in the first and second memory cell blocks 1a and 1b; and the memory cell unit 4 includes multiple nonvolatile memory cells connected in series.

The semiconductor memory device 511 further includes a data control line driver 2, a row decoder 3, a control circuit 40, a Vpgm generation circuit 41a, a Vpass generation circuit 41b, a Vread generation circuit 41c, a substrate potential control circuit 42, an input/output buffer 45, sense amplifier circuits 46, an address buffer 47, and a column decoder 48.

The sense amplifier circuits 46 detect data of the data transfer lines provided in the first and second memory cell blocks 1a and 1b and retain the data to be written. The sense amplifier circuit 46 includes a data latch and includes, for example, a flip-flop circuit.

The sense amplifier circuits 46 are connected to the input/output buffer 45, to and from which input/output data is input and output. The data transfer from the sense amplifier circuits 46 to the input/output buffer 45 is controlled by an output of the column decoder 48 which receives an address signal 47a from the address buffer 47. The input/output buffer 45 is connected to the output driver I/O.

The row decoder 3 selects memory cells of the first and second memory cell blocks 1a and 1b. Specifically, the row decoder 3 controls control gate lines described below and selection gate lines described below.

The substrate potential control circuit 42 controls the potential of, for example, a p-type substrate (or a p-type well) in which the first and second memory cell blocks 1a and 1b are formed. It is desirable to be able to increase the voltage of the substrate potential control circuit 42, particularly to an erasing voltage of 10 V or more when erasing.

The Vpgm generation circuit 41a generates a writing voltage Vpgm used when writing data to the selected memory cells of the first and second memory cell blocks 1a and 1b. The writing voltage Vpgm is increased higher than the source voltage.

The Vpass generation circuit 41b generates an intermediate voltage Vpass for writing that is provided to unselected memory cells when writing data.

The Vread generation circuit 41c generates an intermediate voltage Vread for read-out that is provided to the unselected memory cells when reading data.

The Vpgm generation circuit 41a, the Vpass generation circuit 41b, and the Vread generation circuit 41c are controlled by the control circuit 40 to provide the necessary voltage output to the data control line driver 2 in each of the writing, erasing, and reading states.

The writing voltage Vpgm is, for example, a voltage not less than 10 V (volts) and not more than 30 V. The intermediate voltage Vpass for writing is, for example, a voltage not less than 3 V and not more than 15 V. The intermediate voltage Vread for read-out is, for example, a voltage not less than 1 V and not more than 9 V.

The data control line driver 2 is a switch circuit that applies the voltages recited above to the control gates described below of memory cells for which writing or reading is necessary according to the output of the row decoder 3.

Figure 3:
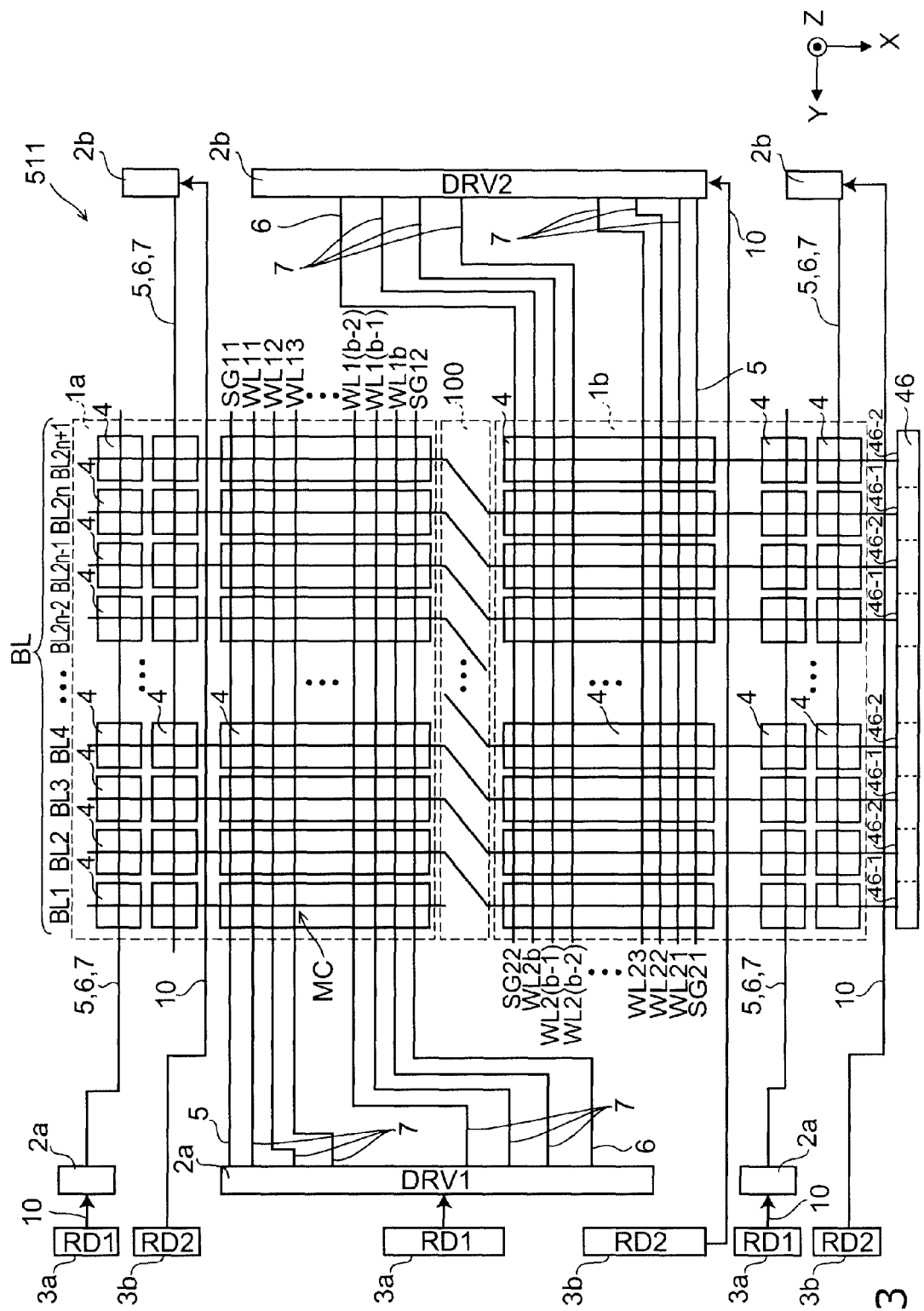
FIG. 3 is a schematic circuit diagram illustrating the configuration of the semiconductor memory device of the first example.

FIG. 3 is a schematic circuit diagram illustrating the configuration of the semiconductor memory device of the first example.

As illustrated in FIG. 3, the first and second memory cell blocks 1a and 1b are provided in the semiconductor memory device 511.

The first and second memory cell blocks 1a and 1b include multiple memory cell units 4. Multiple data control lines 7 are connected to each of the multiple memory cell units 4.

A selection transistor is disposed at each of the end portions of the memory cell unit 4 to select one of the multiple memory cell units 4 and connect the one memory cell unit 4 to a data transfer line BL (data transfer lines BL1 to BL2n+1). The gate electrode of each of the selection transistors is connected to a selection gate line 5 and a selection gate line 6, respectively.

The data transfer lines BL extend in directions mutually orthogonal to the data control lines 7 and are disposed at prescribed spacings in directions mutually orthogonal to the data control lines 7.

The memory cells MC included in the memory cell unit 4 are provided at intersections between the data transfer line BL and the data control lines 7. The writing, retention, erasing, and reading of the data are possible independently for each of the memory cells MC.

The memory cell unit 4 is plurally provided along the alignment direction of the data transfer line BL (the X axis direction) and along the alignment direction of the data control line 7 (the Y axis direction). The first memory cell block 1a includes multiple memory cell units 4 arranged along at least the Y axis direction; and the second memory cell block 1b includes other multiple memory cell units 4 arranged along at least the Y axis direction.

Although two memory cell blocks (the first and second memory cell blocks 1a and 1b) are provided in FIG. 3, the invention is not limited thereto. The number of memory cell blocks may be three or more. Because of the address decoding, it is desirable for the number of the memory cell blocks to be a power-of-two integer.

The data control line driver 2 (the data control line drivers 2a and 2b) that drive the data control lines 7 are provided on the one ends of the data control lines 7 (i.e., data control lines WL, e.g., data control lines WL11 to WL1b and data control lines WL21 to WL2b) connected to the multiple memory cell units 4. The data control lines WL11 to WL1b and the selection gate line 5 are connected to the data control line driver 2a; and the data control lines WL21 to WL2b and the selection gate line 5 are connected to the data control line driver 2b.

For the multiple memory cell units 4 adjacent in the X axis direction as illustrated in FIG. 3, the data control line driver 2 is subdivided into the two data control line drivers 2a and 2b provided at the ends of the memory cell blocks, respectively, for easier disposition of the data control line driver 2 and to match the skew between the data control lines 7 of one memory cell block (e.g., the first memory cell block 1a).

The data control line drivers 2a and 2b are connected to row address selection circuits 3a and 3b, respectively. The memory cells MC connected to the data control lines W11 to WL1b and the memory cells MC connected to the data control lines W21 to WL2b may be selected independently by block.

Although the data control line driver 2 is divided into the data control line drivers 2a and 2b on the left and right of the drawing in the description recited above, the data control line driver 2 may be provided, for example, on either one of the right or left side.

In the first memory cell block 1a, the selection gate line 5 (a block selection line SG11) is provided at one end of each of the memory cell units 4; and the selection gate line 6 (a block selection line SG12) is provided at the other end. In the second memory cell block 1b, the selection gate line 5 (a block selection line SG21) is provided at one end of each of the memory cell units 4; and the selection gate line 6 (a block selection line SG22) is provided at the other end. The selection gate line 5 and the selection gate line 6 are provided parallel to the data control lines 7.

Although not illustrated in FIG. 3 for easier viewing of the drawing, the memory cell unit 4 and the data transfer line BL (the data transfer lines BL1 to BL2n) are connected to each other. Specifically, the memory cell unit 4 and the data transfer line BL are connected to each other on the side of either the selection gate line 5 or 6.

The sense amplifier circuit 46-1, 46-2 is connected to one end of the data transfer line BL. Specifically, the sense amplifier circuits 46-1, 46-2 are disposed collectively on the same side of the one ends of the data transfer lines BL instead of being embedded in and between the memory cell blocks (the first and second memory cell blocks 1a and 1b). In other words, the semiconductor memory device 511 includes multiple first sense amplifier circuits 46-1 provided on the side of the second memory cell block 1b opposite to the first memory cell block 1a and multiple second sense amplifier circuits 46-2 provided on the side of the second memory cell block 1b opposite to the first memory cell block 1a, where the one end of each of the multiple third interconnects LL3 is connected to each of the multiple first sense amplifier circuits 46-1, respectively, and the one end of each of the multiple fourth interconnects LL4 is connected to each of the multiple second sense amplifier circuits 46-2, respectively. Thereby, the pattern periodicity of the memory cells MC can be maintained; and interconnects can be concentrated in one side of the memory cell blocks and can be shared and reduced. Thereby, the ratio of the semiconductor memory device 511 occupied by the memory cells MC can be increased.

Figures 4A, 4B:
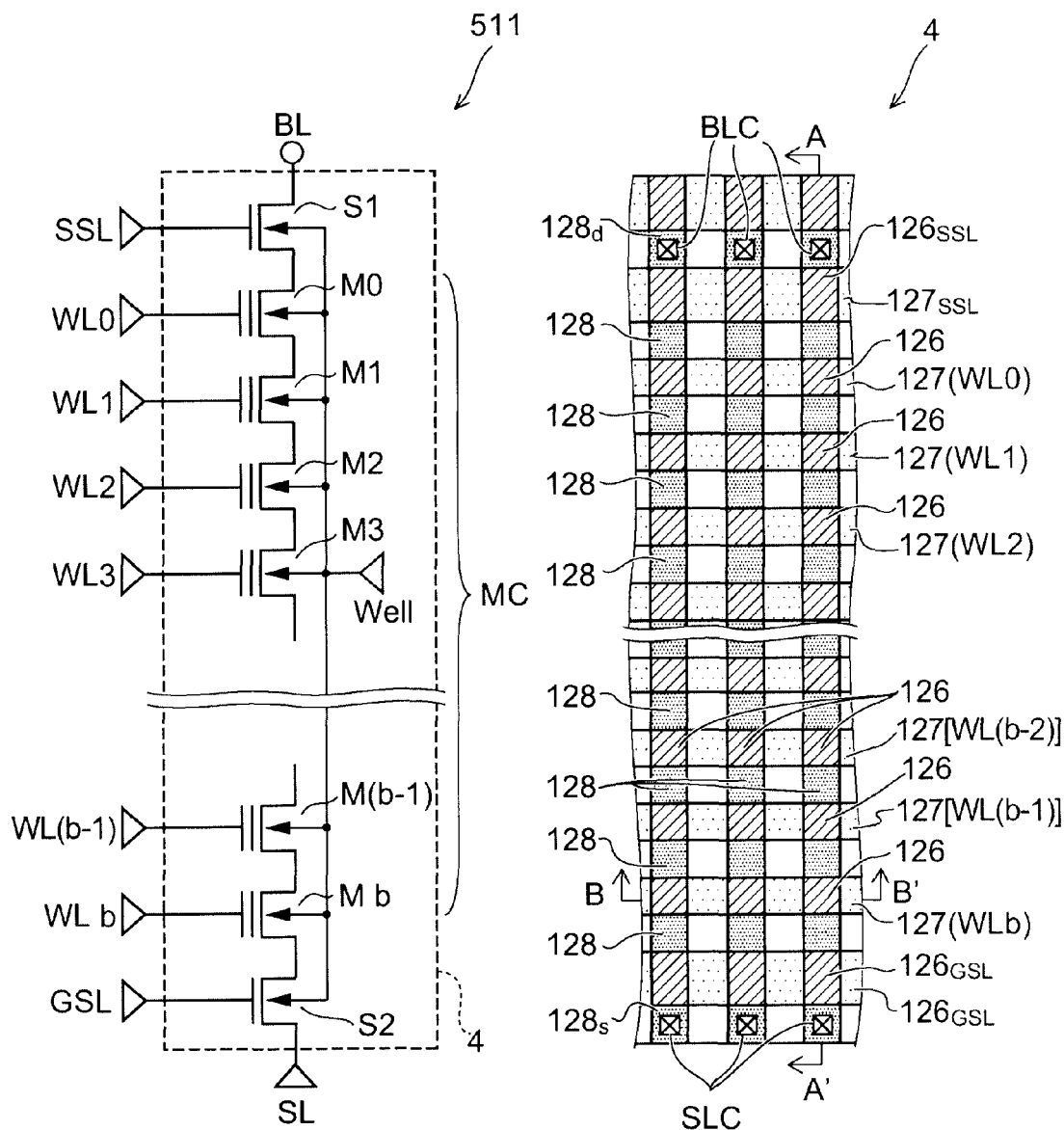
FIGS. 4A and 4B are schematic views illustrating the configuration of the semiconductor memory device of the first example.

FIGS. 4A and 4B are schematic views illustrating the configuration of the semiconductor memory device of the first example.

Namely, FIG. 4A is a circuit diagram illustrating the circuit of the memory cell unit 4 of the semiconductor memory device 511. FIG. 4B is a schematic plan view illustrating the configuration of the memory cell unit 4 of the semiconductor memory device 511. In FIG. 4B, only the structures below the data transfer lines BL are illustrated for easier understanding of the structures of the memory cells.

Figure 5A:
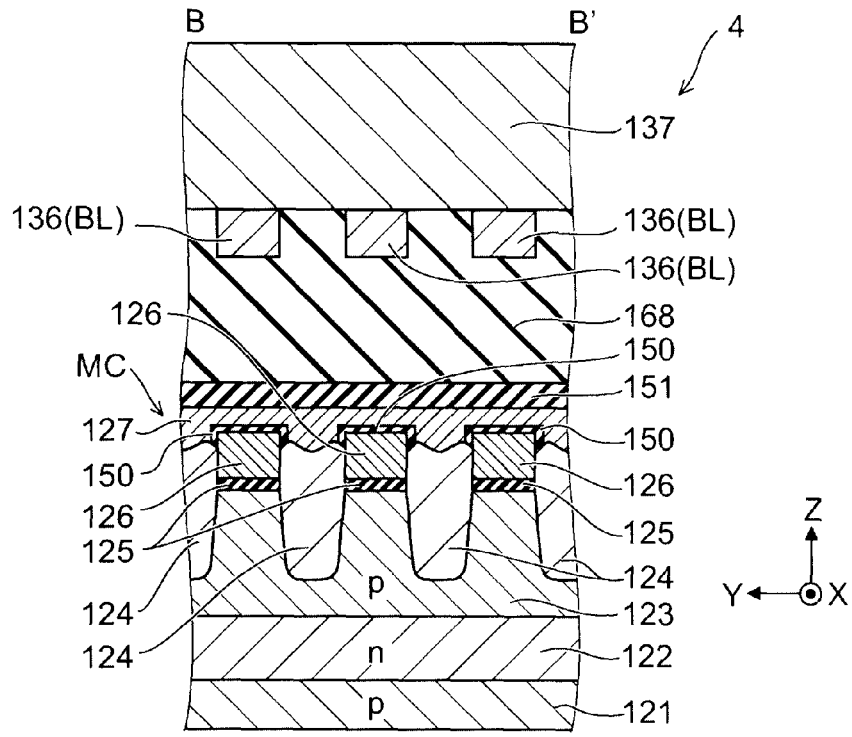
FIGS. 5A and 5B are schematic cross-sectional views illustrating the configuration of the semiconductor memory device of the first example.
Figure 5B:
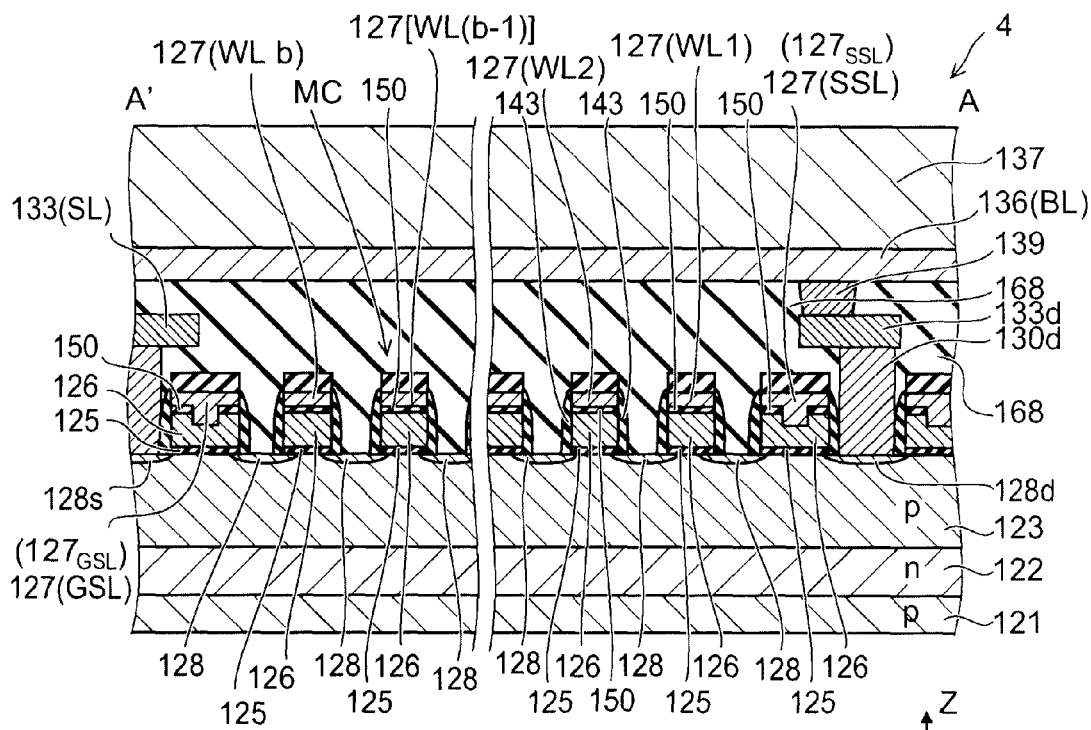

FIGS. 5A and 5B are schematic cross-sectional views illustrating the configuration of the semiconductor memory device of the first example.

Namely, FIG. 5A is a cross-sectional view along line B-B' of FIG. 4B; and FIG. 5B is a cross-sectional view along line A-A' of FIG. 4B.

As illustrated in FIG. 4A, the memory cell unit 4 includes multiple memory cells MC (the memory cells M1 to Mb). Here, b is the number of the memory cells MC (b being an integer not less than 2).

The memory cell MC is a nonvolatile memory cell. The multiple memory cells MC are connected in series; and one end of the multiple memory cells MC is connected to the data transfer line BL via a selection transistor S1. The other end of the multiple memory cells MC is connected to a common source line SL via a selection transistor S2.

The transistors of the multiple memory cells MC are formed on the same well.

Here, the number b of the memory cells MC may be, for example, 16, 32, 34, 66, 68, 130, or 132. It is desirable for the number b of the memory cells MC to be $2^k$, $2^k+2$, or $2^k+4$, where k is an integer not less than 3. For example, the cases where the number of the memory cells MC is $2^k+2$ or $2^k+4$ correspond to the cases where two or four dummy word lines are provided.

Using the block index n, which is an integer not less than 1, as illustrated in FIG. 3, the control electrodes of the memory cells M1 to Mb are connected to the data control lines WLn1 to WLnb, respectively.

The control electrode of the selection transistor S1 is connected to the block selection line (referred to as the block selection line SGn1 or SSL) to select one of the multiple memory cell units 4 along the data transfer line BL and connect the one of the memory cell units 4 to the data transfer line BL.

The control electrode of the selection transistor S2 is connected to the block selection line (referred to as the block selection line SGn2 or GSL).

In other words, the memory cell unit 4 is a NAND memory cell unit.

It is sufficient for either the selection gate line 5 or 6 to be provided in the memory cell unit 4. It is desirable for the selection gate lines 5 and 6 to be aligned in the same direction as the data control lines 7 to increase the density.

An example of the configuration of the memory cell unit 4 will now be described with reference to FIG. 4B, FIG. 5A, and FIG. 5B.

As illustrated in FIG. 4B, FIG. 5A, and FIG. 5B, an n-type silicon region 122 is provided on a p-type silicon substrate 121; and a p-type silicon region 123 is provided on the n-type silicon region 122. The p-type silicon region 123 is divided into multiple regions by an element-separating insulating film 124.

A floating gate 126 is provided on the p-type silicon region 123 via a tunneling gate insulating film 125.

In the p-type silicon region 123, for example, the boron impurity concentration is between $10^{14}$ cm$^{-3}$ and $10^{19}$ cm$^{-3}$. The tunneling gate insulating film 125 may include, for example, a silicon oxide film, a silicon oxynitride film, or a silicon nitride film, or a stacked film including the same. The thickness of the tunneling gate insulating film 125 may be, for example, 1 nm (nanometer) to 20 nm. The floating gate 126 may include, for example, polysilicon; and the thickness of the floating gate 126 may be, for example, 10 nm to 500 nm.

A control gate 127 is provided on the floating gate 126 via an inter-layer insulating film 150. The inter-layer insulating film 150 may include a stacked film of a silicon oxide film/ silicon nitride film/silicon oxide film, a stacked film of a silicon nitride film/silicon oxide film/silicon nitride film/silicon oxide film/silicon nitride film, a stacked film of a silicon oxide film/AlO$_x$ film/silicon oxide film, a stacked film of a silicon oxide film/HfAlO$_x$ film/silicon oxide film, a stacked film of a silicon oxide film/HfO$_x$ film/silicon oxide film, a silicon oxide film, and the like. The thickness of the inter-layer insulating film 150 may be, for example, 2 nm to 30 nm.

The control gate 127 may include, for example, polysilicon, WSi (tungsten silicide), CoSi (cobalt silicide), NiSi (nickel silicide), a stacked film of tungsten and polysilicon, and the like. The thickness of the control gate 127 may be, for example, 10 nm to 500 nm. The control gate 127 is a gate interconnect corresponding to the data control line 7 and the selection gate lines 5 and 6 illustrated in FIG. 3.

It is desirable to provide the element-separating insulating film 124 up to the position of the floating gate 126 of each of the elements as illustrated in FIG. 5A to increase the coupling ratio between the floating gate 126 and the control gate 127.

As illustrated in FIG. 4B, the control gates 127 are connected to each other between adjacent memory cell units 4 to be continuous in the Y axis direction to the boundaries of the memory cell block (the first memory cell block 1a).

A sidewall insulating film 143 is provided on the X axis direction side faces of the gate electrodes (the floating gate 126 and the control gate 127). The sidewall insulating film 143 may include, for example, a silicon nitride film or a silicon oxide film; and the thickness of the sidewall insulating film 143 may be, for example, 5 nm to 200 nm.

An n-type diffusion layer 128 forming source/drain electrodes is provided in the p-type silicon region 123 on both sides of the gate electrodes (the floating gate 126 and the control gate 127).

The n-type diffusion layer 128, the floating gate 126, and the control gate 127 form a floating gate nonvolatile EEPROM cell transistor.

The cell stores digital bit information by storing a charge injected as a tunneling current from the channel into the floating gate 126 via the tunneling gate insulating film 125 to form a nonvolatile semiconductor memory in which information is read by measuring a conductance change of the MOSFET according to the charge amount. The gate length of the floating gate 126 (the width of the floating gate 126 in the X axis direction) may be, for example, not less than 0.01 μm (micrometers) and not more than 0.5 μm. The n-type diffusion layer 128 forming the source/drain regions is doped with, for example, at least one selected from phosphorus, arsenic, and antimony with a surface concentration of $10^{17}$ cm$^{-3}$ to $10^{21}$ cm$^{-3}$. The depth of the n-type diffusion layer 128 is, for example, 10 nm to 500 nm.

The n-type diffusion layer 128 is shared by adjacent memory cells MC to realize a NAND connection.

Thus, the memory cell MC (i.e., each of the multiple memory cells MC included in, e.g., the multiple first cell units), includes: a semiconductor layer of the second conductivity type (e.g., the p-type silicon region 123) including the first diffusion region of the first conductivity type and the second diffusion region of the first conductivity type (the n-type diffusion layers 128); a memory film (e.g., the floating gate 126) provided on the semiconductor layer between the first diffusion region and the second diffusion region; and a control gate (the control gate 127) provided on the memory film. The memory film may be taken to be the floating gate 126. However, the memory film may include, for example, a charge storage layer of an insulating film such as a silicon nitride film.

As illustrated in FIG. 4B and FIG. 5B, a gate electrode $127_{SSL}$ and a gate electrode $127_{GSL}$ are gate electrodes connected to the selection gate line 6 and the selection gate line 5 (the block selection lines) illustrated in FIG. 3. The gate electrode $127_{SSL}$ and the gate electrode $127_{GSL}$ are in the same layer as the control gate 127.

The resistance may be reduced in the portions of the gate electrode $127_{SSL}$ and the gate electrode $127_{GSL}$ by omitting the inter-layer insulating film 150 to connect the floating gate 126 to the gate electrode $127_{SSL}$ and connect the floating gate 126 to the gate electrode $127_{GSL}$.

The gate lengths of the gate electrode $127_{SSL}$ and the gate electrode $127_{GSL}$ are longer than the gate length of the gate electrode of the memory cell MC and may be set to, for example, not less than 0.02 μm and not more than 1 μm. Thereby, a large ON/OFF ratio between when the block is selected and when the block is unselected can be ensured; and malfunctions for programming and reading can be prevented.

A data transfer line side diffusion layer $128_d$, i.e., one of the n-type diffusion layers 128, is connected to a data transfer line 136 (the data transfer line BL) via a contact 139 and a contact $130_d$.

The data transfer line 136 may include, for example, Cu, tungsten, tungsten silicide, aluminum, etc.

The contact 139 is a contact between the data transfer line 136 and an intermediate interconnect layer $133_d$; and the contact $130_d$ is a contact between the intermediate interconnect layer $133_d$ and the data transfer line side diffusion layer $128_d$.

Although the intermediate interconnect layer $133_d$ may be omitted from the connection from the data transfer line 136 to the n-type diffusion layer 128, the number of conductive layers can be prevented from increasing by providing the intermediate interconnect layer $133_d$ and using the intermediate interconnect layer $133_d$ as a portion of the data transfer line rerouting unit 100 described below.

A source line side diffusion layer $128_s$, i.e., one of the n-type diffusion layers 128, is connected to an intermediate interconnect layer 133 forming the common source line SL via a contact $130_s$. The common source line SL may be provided continuously in the Y axis direction to be connected between adjacent memory cell blocks (e.g., the first and second memory cell blocks 1a and 1b).

The n-type diffusion layer 128 may extend to the boundary between adjacent memory cell blocks along the Y axis direction to be used as a source line (the common source line SL).

The contacts recited above (the contact 139, the contact $130_d$, and the contact $130_s$) may include, for example, n-type or p-type doped polysilicon, tungsten, tungsten silicide, Cu, Al, TiN, Ti, etc. The contact may be an electrical conductor region in which such materials are filled into a contact hole.

The intermediate interconnect layer $133_d$ and the intermediate interconnect layer 133 may include, for example, n-type or p-type doped polysilicon, tungsten, tungsten silicide, Cu, Al, TiN, Ti, etc.

The data transfer line 136 may be provided continuously in the X axis direction to be connected between adjacent memory cell blocks (e.g., the first and second memory cell blocks 1a and 1b).

As illustrated in FIG. 4B, either a source line contact SLC or a data transfer line contact BLC is formed between the memory cell units 4 adjacent in the X axis direction. It is desirable for the source line contact SLC and the data transfer line contact BLC to be shared between the memory cell units 4 adjacent in the X axis direction to reduce the surface area of the semiconductor memory device 511.

An inter-layer insulating film 168 made of, for example, $SiO_2$, is provided between the common source line SL and the transistors of the memory cells MC and between the data transfer line 136 and the transistors of the memory cells MC.

Although not-illustrated, an interconnect made of, for example, tungsten, tungsten silicide, aluminum, etc., formed in the same direction as the data control line WL is provided above the data transfer line 136 on an inter-layer insulating film 137 made of, for example, $SiO_2$ or SiN.

Figure 6:
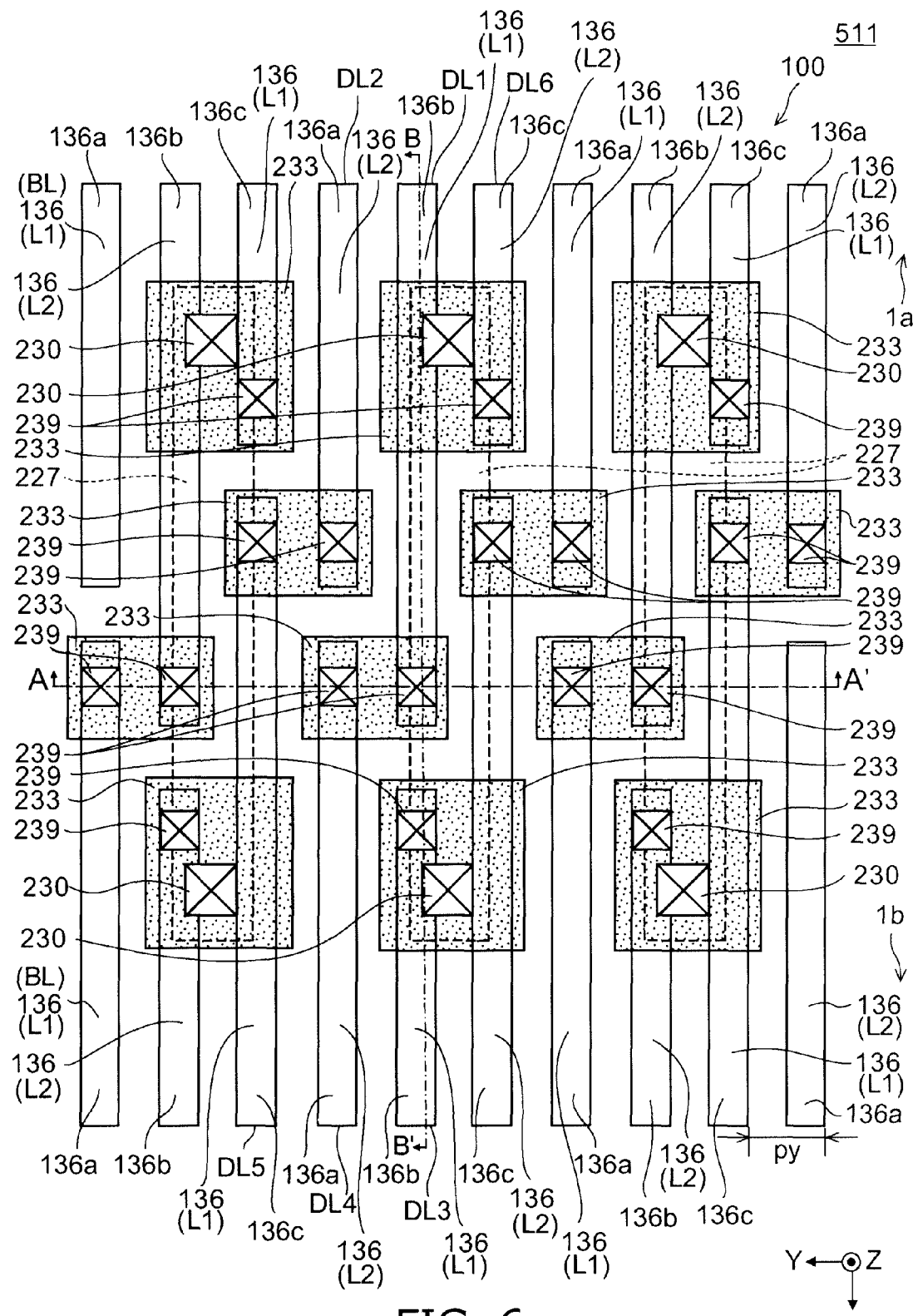
FIG. 6 is a schematic plan view illustrating the configuration of the semiconductor memory device of the first example.

FIG. 6 is a schematic plan view illustrating the configuration of the semiconductor memory device of the first example.

Namely, FIG. 6 illustrates the configuration of the data transfer line rerouting unit 100 provided in the semiconductor memory device 511 of the first example.

FIG. 7 is a schematic cross-sectional view illustrating the configuration of the semiconductor memory device of the first example.

Figure 7A:
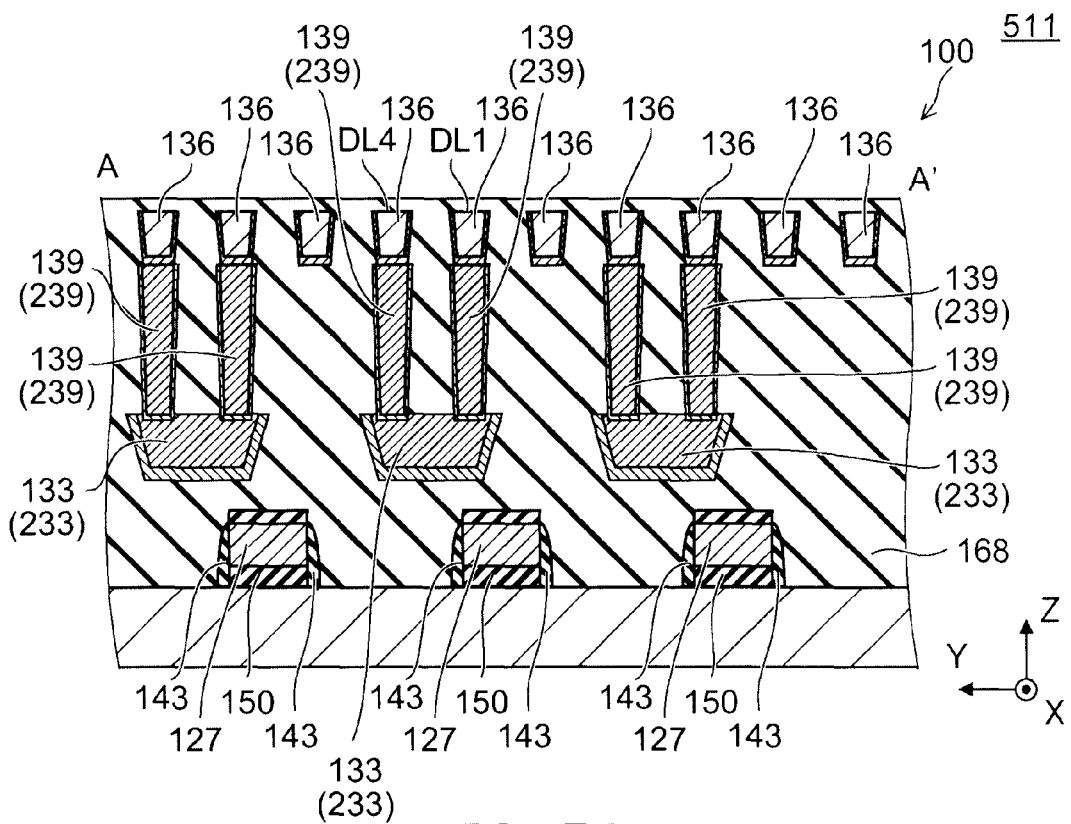
FIGS. 7A and 7B are schematic cross-sectional views illustrating the configuration of the semiconductor memory device of the first example.
Figure 7B:
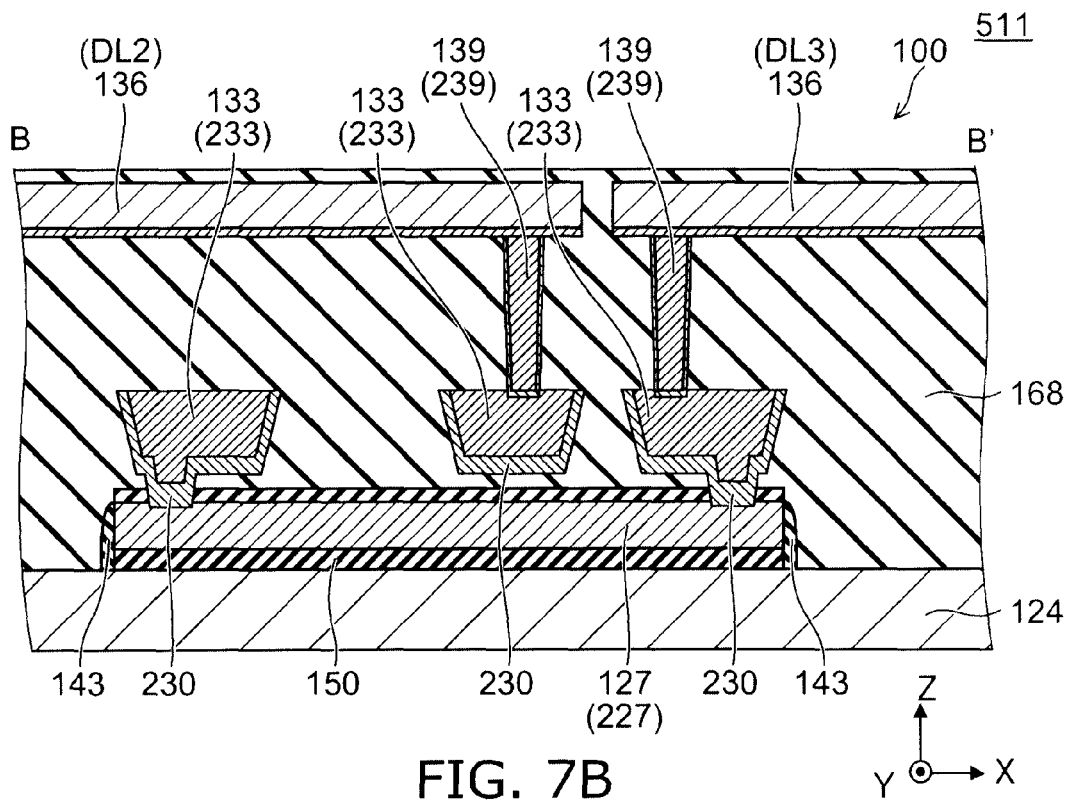

Namely, FIG. 7A is a cross-sectional view along line A-A' of FIG. 6; and FIG. 7B is a cross-sectional view along line B-B' of FIG. 6.

As illustrated in FIG. 6, FIG. 7A, and FIG. 7B, a first reroute interconnect 233, a second reroute interconnect 227, a first reroute contact 239, and a second reroute contact 230 are provided in the data transfer line rerouting unit 100.

The first reroute interconnect 233 may include, for example, the same material as the intermediate interconnect layers 133 and $133_d$ described above; and the first reroute interconnect 233 is an interconnect in the same layer as the intermediate interconnect layers 133 and $133_d$. The first reroute interconnect 233 may be formed, for example, by filling a conductive material into a trench with a barrier metal such as TaN, TiN, TaW, Ti, etc., interposed therebetween. The first reroute interconnect 233 may include tungsten, Cu, Al, AlCu, etc., having a film thickness of 30 nm to 300 nm.

The second reroute interconnect 227 may include, for example, the same material as the control gate 127; and the second reroute interconnect 227 is an interconnect in the same layer as the control gate 127. The second reroute interconnect 227 having such a configuration realizes the rerouting of the data transfer lines in the Y axis direction.

The first reroute contact 239 electrically connects the data transfer line 136 to the first reroute interconnect 233. The first reroute contact 239 also may be formed, for example, by filling a conductive material into a trench with a barrier metal such as TaN, TiN, TaW, Ti, etc., interposed therebetween.

The second reroute contact 230 electrically connects the first reroute interconnect 233 to the second reroute interconnect 227.

The data transfer line 136 also may be formed, for example, by filling a conductive material into a trench with a barrier metal such as TaN, TiN, TaW, Ti, etc., interposed therebetween.

For easier understanding of the drawing in FIG. 6, the dispositions in the X-Y plane are illustrated for the data transfer line 136, the first reroute interconnect 233, the second reroute interconnect 227, the first reroute contact 239, and the second reroute contact 230.

Thus, the interconnect rerouting unit (the data transfer line rerouting unit 100) includes the first reroute interconnect layer (e.g., the intermediate interconnect layers 133 and $133_d$, the first reroute interconnect 233, etc.). The distance along the third direction (Z axis direction) between the first reroute interconnect layer and the semiconductor layer (e.g., the p-type silicon region 123) is different from the distance along the third direction between the first interconnect LL1 and the semiconductor layer. One of the multiple fourth interconnects LL4 is electrically connected to one of the multiple first interconnects LL1 via the first reroute interconnect layer.

With the substrate (e.g., the p-type silicon substrate 121) as the reference, the height of the first reroute interconnect layer is lower than that of the data transfer line 136 and higher than that of the control gate 127. In other words, the distance along the third direction between the first reroute interconnect layer and the semiconductor layer (e.g., the p-type silicon region 123) is smaller than the distance along the third direction between the first interconnect LL1 and the semiconductor layer and greater than the distance along the third direction between the control gate 127 and the semiconductor layer.

The interconnect rerouting unit (the data transfer line rerouting unit 100) may include the second reroute interconnect layer (e.g., the second reroute interconnect 227). The second reroute interconnect layer is an interconnect in the same layer as the control gate 127. In other words, the distance along the third direction between the second reroute interconnect layer and the semiconductor layer (e.g., the p-type silicon region 123) is substantially equal to the distance along the third direction between the control gate 127 and the semiconductor layer. One of the multiple third interconnects LL3 is electrically connected to one of the multiple second interconnects LL2 via the second reroute interconnect layer.

The interconnect rerouting unit may further include multiple first reroute interconnect layers. The distance along the third direction between each of the multiple first reroute interconnect layers and the semiconductor layer is smaller than the distance along the third direction between the first interconnect LL1 and the semiconductor layer and greater than the distance along the third direction between the control gate 127 and the semiconductor layer. One of the multiple fourth interconnects LL4 is electrically connected to one of the multiple first interconnects LL1 via one of the multiple first reroute interconnect layers. On the other hand, one of the multiple third interconnects LL3 is electrically connected to one of the multiple second interconnects LL2 via the second reroute interconnect layer.

Also, the interconnect rerouting unit may further include multiple first reroute contacts 239 and multiple second reroute contacts 230. One of the multiple first reroute contacts 239 electrically connects one of the multiple fourth interconnects LL4 to one of the multiple first reroute interconnect layers (e.g., the first reroute interconnect 233). One other of the multiple first reroute contacts 239 electrically connects one of the multiple first interconnects LL1 to the one of the multiple first reroute interconnect layers recited above (e.g., the first reroute interconnect 233). One of the multiple second reroute contacts 230 electrically connects one other of the multiple first reroute interconnect layers to the second reroute interconnect layer (e.g., the second reroute interconnect 227). One other of the multiple second reroute contacts 230 electrically connects still one other of the multiple first reroute interconnect layers to the second reroute interconnect layer.

Thereby, one of the multiple fourth interconnects LL4 is electrically connected to one of the multiple first interconnects LL1 via one of the first reroute interconnect layers. Also, one of the multiple third interconnects LL3 is electrically connected to one of the multiple second interconnects LL2 via the second reroute interconnect layer and one other of the first reroute interconnect layers.

The data transfer line 136 extends from the first and second memory cell blocks 1a and 1b into the region of the data transfer line rerouting unit 100. The data transfer line 136 includes the low resistance interconnect L1 and the high resistance interconnect L2 alternately adjacent in the Y axis direction. Although a pitch py of the data transfer line 136 is the same for the low resistance interconnect L1 and the high resistance interconnect L2, the widths of the low resistance interconnect L1 and the high resistance interconnect L2 may be different from each other (or, the thicknesses of the low resistance interconnect L1 and the high resistance interconnect L2 may be different from each other). The pitch py of the data transfer line 136 is, for example, not less than 20 nm and not more than 100 nm. The width of the data transfer line 136 (the interconnect width) is, for example, not less than 10 nm and not more than 50 nm. For example, the width of the low resistance interconnect L1 and the width of the high resistance interconnect L2 are different from each other; and the width of the low resistance interconnect L1 is, for example, not less than 10 nm and not more than 50 nm.

The first reroute contacts 239 mutually adjacent in the Y axis direction are formed, for example, with the same minimum pitch py as the data transfer line 136.

Because three types of interconnect connection patterns are used in the data transfer line rerouting unit 100 in this specific example, FIG. 6 illustrates the data transfer line 136 as the data transfer lines 136a, 136b, and 136c corresponding to the three types of interconnect connection patterns.

As described below, the data transfer line 136 is formed by sidewall patterning. The low resistance interconnect L1 of the data transfer lines 136 extending from the first memory cell block 1a is on the same line of extension in the X axis direction as the low resistance interconnect L1 of the data transfer lines 136 extending from the second memory cell block 1b. Similarly, the high resistance interconnect L2 of the data transfer lines 136 extending from the first memory cell block 1a is on the same line of extension in the X axis direction as the high resistance interconnect L2 of the data transfer lines 136 extending from the second memory cell block 1b.

It is possible to ensure a registration margin of the data transfer line 136 and the first reroute contact 239 equal to or greater than the spacing between the data transfer lines 136 in the memory cell block.

As illustrated in FIG. 6, the widths of the first reroute interconnect 233 and the second reroute interconnect 227 can be relaxed to, for example, at least twice the width of the data transfer line 136. Thereby, lithography having a low resolution of lower cost than that of the data transfer line 136 can be used; and the data transfer line rerouting unit 100 can be formed with lower costs.

As illustrated in FIG. 6, the diameter of the second reroute contact 230 may be, for example, at least 1.2 times that of the first reroute contact 239. In other words, the diameter of the second reroute contact 230 may be at least 1.2 times the diameter of the first reroute contact 239. Thereby, lithography having a low resolution of lower cost than that of the first reroute contact 239 can be used; and the data transfer rerouting unit 100 can be formed with lower costs.

It is unnecessary to bend the data transfer line 136 in the X-Y plane in the data transfer rerouting unit 100; and the data transfer line 136 in the region of the data transfer rerouting unit 100 can be disposed densely in the Y axis direction similarly to the first and second memory cell blocks 1a and 1b.

In the data transfer line rerouting unit 100, the minimum width of the first reroute interconnect 233, the minimum spacing between the first reroute interconnects 233, the minimum width of the second reroute interconnect 227, and the minimum spacing between the second reroute interconnects 227 can be ensured equal to or greater than the width of the data transfer line 136 and the spacing between the data transfer lines 136.

The data transfer line rerouting unit 100 can be formed using the interconnect components included in the first and second memory cell blocks 1a and 1b and can be formed without adding new processes.

In other words, the minimum interconnect pitch necessary in the data transfer line rerouting unit 100 is the pitch py of the data transfer line 136. The minimum width of the contact and the minimum width of the spacing between the contacts are the width of the first reroute contact 239 directly connected to the data transfer line 136. Such values are values of the dimensions necessary in the processes forming the structural components included in the first and second memory cell blocks 1a and 1b; and it is unnecessary to form contacts smaller than those of conventional art or fine interconnects. Accordingly, lithography having a resolution higher than that of conventional art is unnecessary; and the desired rerouting can be realized.

In other words, the first reroute contact 239 can be formed, for example, with the same dimensions as the contacts connecting the data transfer line 136 to the memory cells; and the first reroute contact 239 can be formed without more contact processes or interconnect processes.

The data transfer line rerouting unit 100 of this specific example includes: an interconnect layer in which the data transfer lines 136 are provided to align; two layers, i.e., the first interconnect layer (the first reroute interconnect 233) and the second interconnect layer (the second reroute interconnect 227), provided in layers different from that of the data transfer lines 136 and having a minimum interconnect width at least twice that of the data transfer line 136; the first contact (the first reroute contact 239) selectively connecting the data transfer line 136 to the first interconnect layer; and the second contact (the second reroute contact 230) connecting the first interconnect layer to the second interconnect layer, where the second contact (the second reroute contact 230) has a diameter at least 1.2 times that of the first contact (the first reroute contact 239).

As illustrated in FIG. 6, the data transfer line 136 extending from the second memory cell block 1b side is electrically connected to the data transfer line 136 positioned one line to the right on the first memory cell block 1a side.

For example, the data transfer line 136a on the second memory cell block 1b side is electrically connected to the data transfer line 136b on the first memory cell block 1a side via the first reroute contact 239 and the first reroute interconnect 233.

The data transfer line 136b on the second memory cell block 1b side is electrically connected to the data transfer line 136c on the first memory cell block 1a side via the first reroute contact 239, the first reroute interconnect 233, and the second reroute interconnect 227.

The data transfer line 136c on the second memory cell block 1b side is electrically connected to the data transfer line 136a on the first memory cell block 1a side via the first reroute contact 239 and the first reroute interconnect 233.

By such a configuration, the data transfer lines 136 of the first and second memory cell blocks 1a and 1b disposed at mutually diagonal positions in the X-Y plane can be electrically connected to each other.

A configuration also is possible by using, for example, the configuration illustrated in FIG. 3 and FIG. 6 mirrored around the X axis direction.

Although the data transfer lines 136 disposed at mutually diagonal positions in the X-Y plane are electrically connected to each other by shifting one line along the Y axis direction in this specific example, the invention is not limited thereto. In other words, it is sufficient for the low resistance interconnect L1 of the first memory cell block 1a to be electrically connected to the high resistance interconnect L2 of the second memory cell block 1b and for the high resistance interconnect L2 of the first memory cell block 1a to be electrically connected to the low resistance interconnect L1 of the second memory cell block 1b.

For example, the data transfer line 136 of the first memory cell block 1a may be electrically connected to the data transfer line 136 of the second memory cell block 1b by shifting an odd number of lines along the Y axis direction. In the case of a configuration to reroute to an odd number of lines of three or more such as three lines, five lines, etc., it is sufficient, for example, to repeat the rerouting of one line three times, five times, etc. Therefore, the data transfer line rerouting unit 100 can be realized with the same number of layers and the same number of contact layers as the semiconductor memory device 511 by, for example, adjusting the pattern of the first reroute interconnect 233 and the second reroute interconnect 227.

Here, the number of the data transfer lines 136 increases according to the number of lines shifted during the rerouting. Therefore, the increase of the number of the data transfer lines 136 can be kept to a minimum by using a reroute configuration that shifts one line as in the semiconductor memory device 511; and an increase of the surface area of the semiconductor memory device can be suppressed.

The data transfer line rerouting unit 100 can reroute the data transfer lines 136 without an external signal input. Accordingly, it is unnecessary to add a circuit; and the circuit surface area can be reduced. Moreover, the data transfer line rerouting unit 100 has a structure in which the data transfer lines 136 are electrically connected by electrical conductors without using a semiconductor substrate. Therefore, a leakage current does not flow from the interconnects into the semiconductor substrate even when the voltage between the interconnects swings between positive and negative. Thereby, it is possible to transmit the potential of the data transfer line 136 between the first and second memory cell blocks 1a and 1b while keeping the potential changes and the current changes of the data transfer line 136 small.

In the semiconductor memory device 511, it is likable for the number of the memory cells MC included in the memory cell unit 4 belonging to the first memory cell block 1a to be substantially equal to the number of the memory cells MC included in the memory cell unit 4 belonging to the second memory cell block 1b. It is likable for the length along the X axis direction of the data transfer line 136 belonging to the first memory cell block 1a to be substantially equal to the length along the X axis direction of the data transfer line 136 belonging to the second memory cell block 1b. The effects of suppressing the interconnect delay and improving the operating characteristics and the reliability, in particular, in such a configuration in which the low resistance interconnect L1 and the high resistance interconnect L2 are disposed alternately (e.g., the configuration in which the interconnects are formed by sidewall patterning with twice the density of the lithography).

An example of a formation method of the data transfer line 136 will now be described.

FIG. 8A to FIG. 9C are schematic cross-sectional views in order of the processes, illustrating the method for constructing the data transfer lines of the semiconductor memory device of the first example by double patterning using sidewall members (Sidewall Double Patterning (SDP)).

Figure 8A:
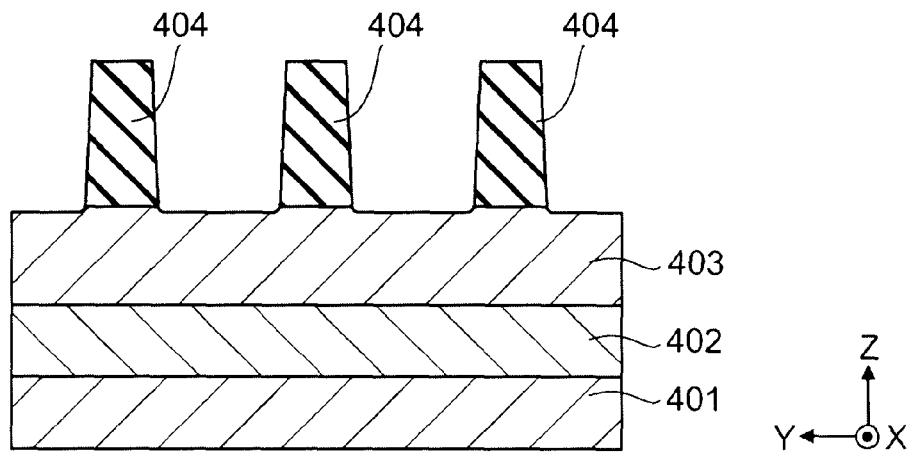
FIG. 8A to FIG. 9C are schematic cross-sectional views in order of the processes, illustrating a method for constructing the data transfer lines of the semiconductor memory device of the first example.

As illustrated in FIG. 8A, an inter-layer film 402 is formed on a major surface of a base film 401; and an insulating film 403 is formed on the inter-layer film 402. The base film 401 is, for example, a film on the surface of a base member in a layer below that of the data transfer lines 136 to be constructed.

The insulating film 403 may include a silicon oxide film, a silicon oxynitride film, a SiON film, etc. The inter-layer film 402 may include, for example, a silicon nitride film, a SiCN film, a SiON film, etc. The base film 401 may include a material different from that of the inter-layer film 402. The base film 401 may include, for example, a silicon oxide film, a silicon oxynitride film, a SiON film, etc.

After forming a core member film forming a core member 404 on the major surface of the insulating film 403, a resist is formed on the core member film by lithography with a pitch of twice the pitch py of the data transfer line 136. The pitch of the resist may be set to, for example, the minimum pitch of the patterning precision of the lithography. The width of the resist may be set to, for example, an interconnect width in the range of 30 nm to 200 nm. The core member film is patterned using the resist as a mask to form the core member 404. The core member 404 may include a silicon oxide film or a silicon nitride film. Further, the core member 404 may include an amorphous silicon film or a carbon film.

The core member 404 is formed with a width reduced to half of the assumed pitch of the data transfer line 136. In such a case, it can be taken that the core member 404 is formed slightly larger than half the assumed pitch of the data transfer line 136 due to the fluctuation of the width of the resist. The assumed pitch of the data transfer line 136 is a value, for example, between 10 nm and 100 nm.

Figure 8B:
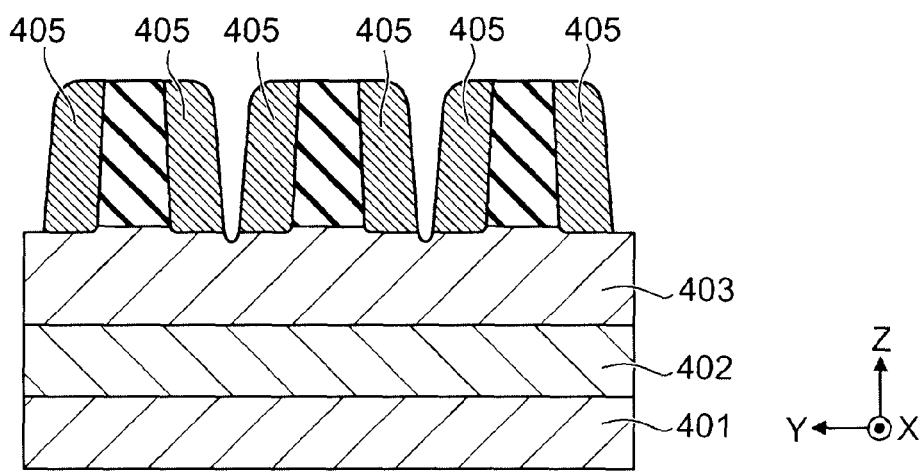

As illustrated in FIG. 8B, a sidewall film 405 is formed to cover the upper face and the side faces of the core member 404. The sidewall film 405 includes a material different from that of the core member 404. The sidewall film 405 may include, for example, silicon, $Al_2O_3$, etc. As long as the sidewall film 405 is a different film from the core member 404, the sidewall film 405 may include a silicon oxide film or a silicon nitride film; and further, the sidewall film 405 may include an amorphous silicon film or a carbon film. The thickness of the sidewall film 405 along the Y axis direction is set to about half the length of the assumed pitch of the data transfer line 136.

Then, anisotropic etching is performed to expose a portion of the insulating film 403. Thereby, the sidewall film 405 is formed on the sidewalls of the core member 404.

Figure 8C:
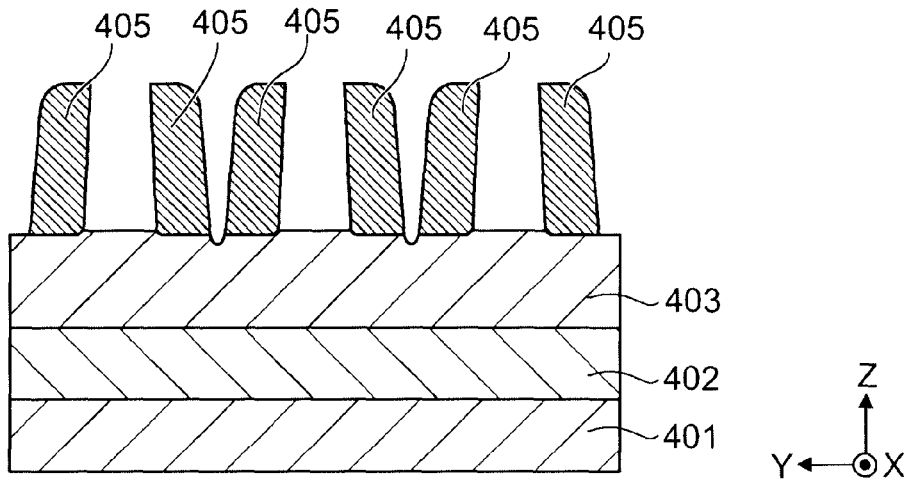

The core member 404 is removed as illustrated in FIG. 8C. The removal of the core member 404 may be performed by etching using, for example, a hydrofluoric acid-based etchant or RIE (Reactive Ion Etching).

Figure 9A:
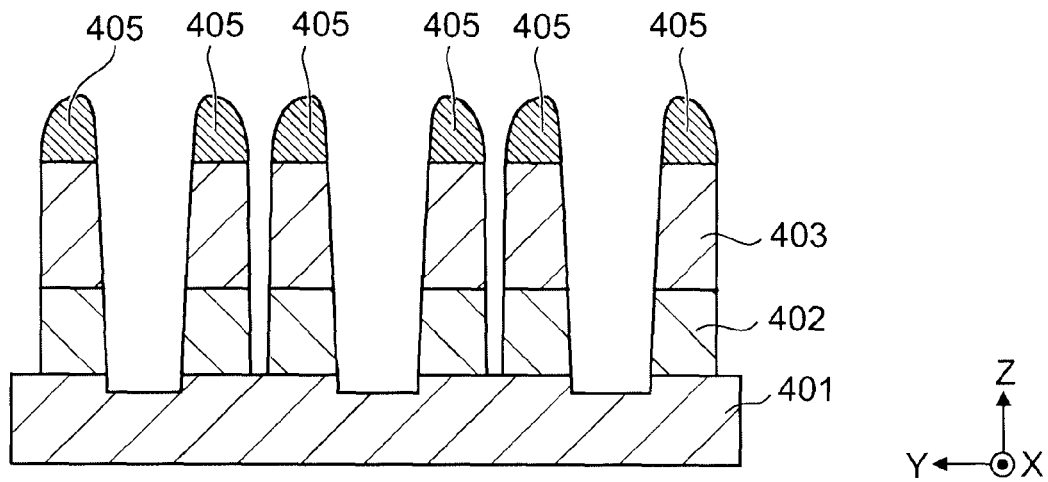

As illustrated in FIG. 9A, the insulating film 403 and the inter-layer film 402 are etched using the sidewall film 405 as a mask. Such etching may be anisotropic etching. In such a case, the base film 401 may include a material different from that of the inter-layer film 402 (a material having an etching rate lower than that of the inter-layer film 402) such that the etching stops at the interface between the inter-layer film 402 and the base film 401. This process is a so-called sidewall transfer process.

Figure 9B:
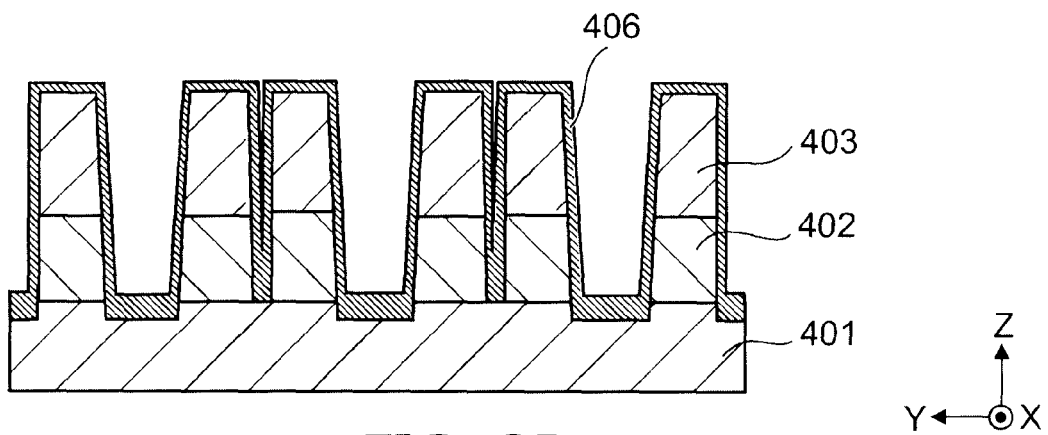

As illustrated in FIG. 9B, the sidewall film 405 that was used as a mask is removed; and a barrier metal 406 is formed on the exposed upper face of the base film 401, the side faces of the inter-layer film 402, and the upper face and side faces of the insulating film 403. The barrier metal 406 may include, for example, TaN, TaW, Ti, TiN, etc. The thickness of the barrier metal 406 may be, for example, 1 nm to 10 nm.

A metal film 407 is formed on the barrier metal 406 to fill the trench; and planarizing is performed by, for example, CMP (Chemical Mechanical Polishing). The metal film 407 may include a material having a resistance lower than that of the barrier metal 406. The metal film 407 may include, for example, Cu, Al, and W. The metal film 407 (including the barrier metal 406) filled into the trench forms the data transfer line 136. The data transfer line 136 forms a so-called damascene structure. The cross-sectional configuration of the data transfer line 136 (the cross-sectional configuration when the data transfer line 136 is cut in a plane perpendicular to the first direction) is a reverse-tapered configuration.

The manufacturing method described above in regard to FIG. 8A to FIG. 8C and FIG. 9A to FIG. 9C can realize a double pitch of the pitch constructed by the lithography by using the sidewall film 405. Such double pitch construction technology is referred to as double patterning using sidewall members (Sidewall Double Patterning (SDP)).

As illustrated in FIG. 9A, the width of the trench made in the inter-layer film 402 and the insulating film 403 fluctuates with the fluctuation of the dimensions of the resist and with twice the fluctuation of the film thickness of the sidewall film 405. Therefore, wide trenches and narrow trenches are made to be arranged alternately.

Figure 9C:
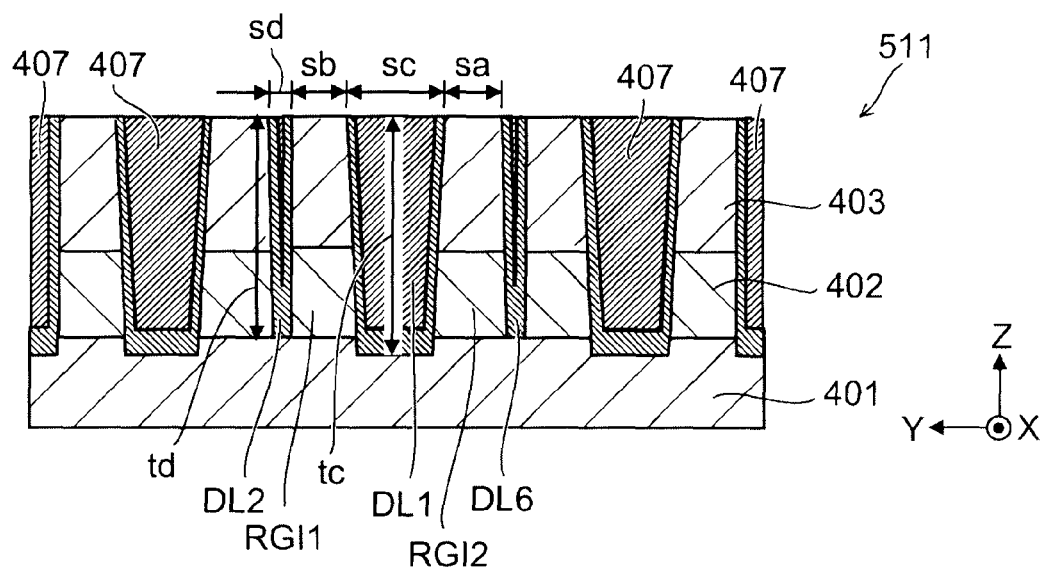

Therefore, as illustrated in FIG. 9C, the wide data transfer lines 136 are arranged alternately with the narrow data transfer lines 136.

Further, as illustrated in FIG. 9C, the wide trenches are deep and the narrow trenches are shallow due to microloading effects. Therefore, the film thickness of the wide data transfer line 136 is thick; and the film thickness of the narrow data transfer line 136 is thin.

As the data transfer line 136 becomes narrower and shallower, there is a trend for the crystal grain size of the metal thereof to decrease. Thereby, the resistance of the crystal grain boundary of the metal and the boundary resistance between the metal film 407 and the barrier metal 406 increases. Such effects cause greater differences of resistances than those due to differences of the cross-sectional areas of the metal film 407.

Thus, the width and the thickness of the data transfer lines 136 fluctuate due to the fluctuation of the sidewall patterning; and the effects of the fluctuation of the crystal grain size is added such that the difference of the resistance values of the alternately repeating low resistance and high resistance of the data transfer lines 136 is even greater.

As illustrated in FIG. 9C, the fluctuation of the width of the insulating film between the data transfer lines 136 (the difference between a width sa and a width sb) is determined by the fluctuation of the thickness (the thickness along the Y axis direction) of the sidewall film 405.

The fluctuation of the width of the data transfer line 136 (the fluctuation of a width sd) is determined by the sum of the fluctuation of the width (the width along the Y axis direction) of the sidewall film 405 and the fluctuation of the width (the width along the Y axis direction) of the core member 404. Accordingly, the difference of the widths of adjacent data transfer lines 136 (the difference between a width sc and the width sd) is greater than the difference of the widths of adjacent insulating films between the data transfer lines 136 (the difference between the width sa and the width sb).

In other words, in the semiconductor memory device 511 as illustrated in FIG. 9C, the high resistance interconnect L2 (the second interconnect) of the first region further includes the sixth data transfer line DL6 adjacent to the first data transfer line DL1 on the side of the first data transfer line DL1 opposite to the second data transfer line DL2 to connect to one end of the sixth memory cell unit MCU6 which includes multiple memory cells, where the sixth data transfer line DL6 has an electrical resistance higher than that of the first data transfer line DL1.

The width of the sixth data transfer line DL6 is the almost same as the width of the second data transfer line DL2. The absolute value of the difference between the width (the width sc) of the first data transfer line DL1 and the width (the width sd) of the second data transfer line DL2 is greater than the absolute value of the difference between the width (the width sb) of a first insulating region RGI1 from the first data transfer line DL1 to the second data transfer line DL2 and the width (the width sa) of a second insulating region RGI2 from the first data transfer line DL1 to the sixth data transfer line DL6.

As illustrated in FIG. 9C, the width of the data transfer line 136 can be defined as to be the top face width (the width sc and the width sd) of the data transfer line 136 along the Y axis direction. Now, "top face" is defined as the face on the side opposite to the base film 401, i.e., the p-type silicon substrate 121.

The thickness of the data transfer line 136 is the thickness along the Z axis direction (a thickness tc and a thickness td) of the data transfer line 136.

The feature recited above in which the fluctuation of the width of the insulating film between the data transfer lines 136 is smaller than the fluctuation of the width of the data transfer line 136 at the top face is an advantageous structure for ensuring the breakdown voltage of the insulating film between the data transfer lines 136.

In the semiconductor memory device 510 according to this embodiment and the semiconductor memory device 511 according to the first example, the fluctuation of the electrical resistance of the interconnects can be compensated by providing the data transfer line rerouting unit 100, the interconnect delay can be suppressed, and the operating characteristics and the reliability can be improved even in the case where the low resistance interconnect L1 and the high resistance interconnect L2 are formed due to the fluctuation of the sidewall patterning as recited above.

For example, the resistance of the first data transfer line DL1 belonging to the first memory cell block 1a is taken to be a first resistance R1; and the resistance of the second data transfer line DL2 belonging to the first memory cell block 1a is taken to be R1(1+ΔR). Here, ER is taken to be a positive value. The capacitances of the regions including the first data transfer line DL1 and the second data transfer line DL2 are taken to be a first capacitance C1 by replacing the capacitances with a lumped constant.

On the other hand, the resistance of the third data transfer line DL3 belonging to the second memory cell block 1b is taken to be a second resistance R2; and the resistance of the fourth data transfer line DL4 belonging to the second memory cell block 1b can be approximated as R2(1+ΔR). The capacitances of the regions including the third data transfer line DL3 and the fourth data transfer line DL4 are taken to be a second capacitance C2 by replacing the capacitances with a lumped constant. Because the ratio of the resistances of the data transfer lines 136 adjacent to each other on the line of extension in the X axis direction is the ratio of the first resistance R1 and the second resistance R2, the second capacitance C2 can be approximated by C1×(R2/R1) in the case where the capacitance between the data transfer lines is dominant.

In such a case, the resistances are averaged by providing the data transfer line rerouting unit 100 in the semiconductor memory device 510 according to this embodiment and the semiconductor memory device 511 according to the first example by electrically connecting the low resistance interconnect L1 and the high resistance interconnect L2 to each other. In other words, the time constant of the interconnect delay from the sense amplifier circuit 46 to the memory cell unit 4 positioned most distally thereto is {R1C1×(1+ΔR)+R2C2} or {R1C1+R2C2×(1+ΔR)} when the change of the resistance of the data transfer line rerouting unit 100 is sufficiently small.

The difference of the time constants between adjacent data transfer lines BL (the data transfer lines 136) is (R1C1−R2C2)×ΔR.

Here, in the case where the lengths of the data transfer lines BL are substantially equal between the first memory cell block 1a and the second memory cell block 1b, the difference of the time constants recited above of (R1C1−R2C2)×ΔR is substantially zero.

Figure 10:
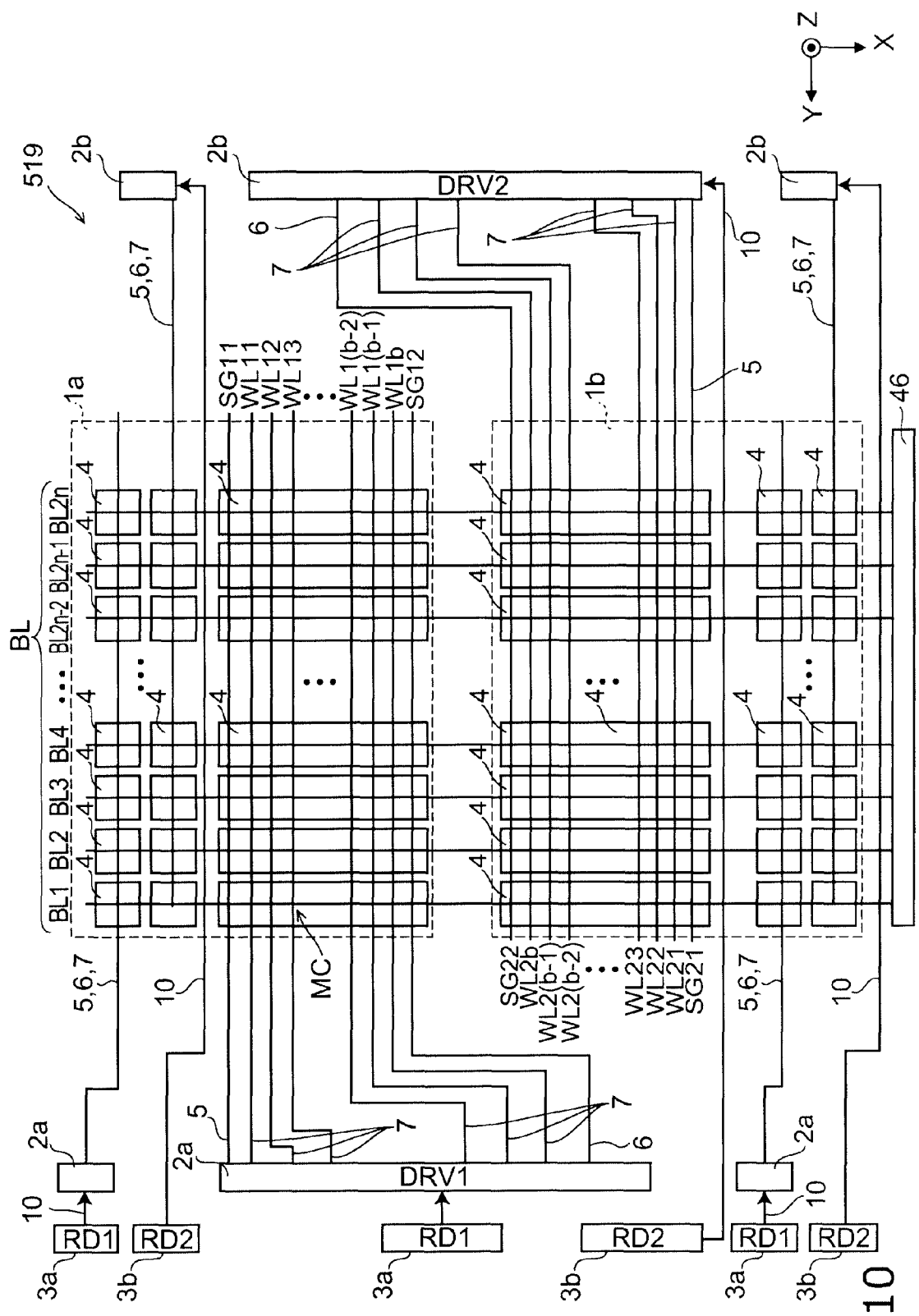
FIG. 10 is a schematic circuit diagram illustrating the configuration of a semiconductor memory device of a comparative example.

FIG. 10 is a schematic circuit diagram illustrating the configuration of a semiconductor memory device of a comparative example.

As illustrated in FIG. 10, the data transfer line rerouting unit 100 is not provided in the semiconductor memory device 519 of the comparative example. In other words, for example, the first data transfer line DL1 and the third data transfer line DL3 of FIG. 1 are connected to each other; and the second data transfer line DL2 and the fourth data transfer line DL4 are connected to each other. In other words, the low resistance interconnects L1 adjacent in the X axis direction are connected to each other; and the high resistance interconnects L2 adjacent in the X axis direction are connected to each other. Otherwise, the semiconductor memory device 519 is the same as the semiconductor memory device 511, and a description is therefore omitted.

In the semiconductor memory device 519 of the comparative example, the time constant of the interconnect delay from the sense amplifier circuit 46 to the memory cell unit positioned most distally thereto for the high resistance interconnect L2 is (R1C1+R2C2)×(1+ΔR) for the maximum case and is greater than that of the semiconductor memory device 511 according to the first example.

The difference of the time constants between adjacent data transfer lines BL (the data transfer lines 136) is (R1C1+R2C2)×ΔR which is greater than that of the semiconductor memory device 511 according to the first example and cannot be zero.

Therefore, in the semiconductor memory device 519, the read-out speed decreases; the read-out margin decreases; electromigration and stress induced migration occur easily; and the reliability deteriorates.

In other words, in the data transfer lines BL having high interconnect resistances, the interconnect delay is large when reading the information stored in the memory cells MC; and the read-out speed decreases. Because the interconnect resistance is connected in series with the memory cells MC, the current flowing in the memory cells MC decreases as the interconnect resistance increases. Therefore, it becomes difficult to discriminate between the cut off state and the conducting state of the memory cells MC; and the read-out margin decreases. For example, in a NAND flash memory array, an interconnect having a length of, for example, not less than 2 mm may be used as the data transfer line BL to increase the proportion occupied by the memory cells MC; and the sense amplifier circuit 46 is electrically connected to the end of the data transfer line BL. A delay occurs based on the time constant of the interconnect between the memory cells MC proximal to the sense amplifier circuit 46 and the memory cells MC most distal to the sense amplifier circuit 46; and the memory cells MC are read at the same speed to increase the margin of the read-out time because.

Moreover, reliability deterioration such as electromigration and stress induced migration may occur in the data transfer lines BL having narrow widths.

Conversely, in the semiconductor memory device 510 according to this embodiment and the semiconductor memory device 511 according to the first example, the fluctuation of the electrical resistance of the interconnects is compensated by providing the data transfer line rerouting unit 100; the interconnect delay can be suppressed; and the operating speed and the reliability can be improved.

Reducing the difference between the number NA of the memory cells MC included in the memory cell unit 4 of the first memory cell block 1a and the number NB of the memory cells MC included in the memory cell unit 4 of the second memory cell block 1b to not more than 10% can suppress the difference of the time constants between adjacent data transfer lines BL to not more than 10% of the difference of (R1C1+R2C2)×ΔR of the time constants of the semiconductor memory device 519 of the comparative example, which is desirable for circuit operations.

In other words, by such settings, the circuit variance due to the time constant fluctuation originated from the interconnect structure fluctuation can be suppressed to not more than 10%; and a circuit having small operational fluctuations can be realized. Relative fluctuations of the width of the data transfer line 136 of about 10% are tolerated to guarantee the dimension fluctuation precision of the lithography. By suppressing the relative fluctuation of the time constants of the mutually adjacent interconnects recited above to not more than 10%, the fluctuation of the time constant can be smaller than the relative fluctuation of the width of the data transfer line 136; and the entire fluctuation of the time constants can be reduced further.

In other words, the number of the memory cells MC included in the first memory cell unit MCU1 can be set equal to the number of the memory cells MC included in the second memory cell unit MCU2; and the number of the memory cells MC included in the third memory cell unit MCU3 can be set equal to the number of the memory cell MC included in the fourth memory cell unit MCU4. The absolute value of (NA−NB)/(NA+NB) can be 0.1 or less, where NA is the number of the memory cells MC included in the first memory cell unit MCU1 and NB is the number of the memory cells MC included in the third memory cell unit MCU3.

Thereby, the fluctuation of the time constants can be reduced; and the operating characteristics can be improved even more.

It is more likeable for the absolute value of (NA−NB)/(NA+NB) to be not more than 0.05. Thereby, the operating characteristics can be improved even more.

According to the semiconductor memory device 511 of this example, in the cases where the read-out is performed simultaneously and the writing is performed simultaneously on the memory cells MC included in the memory cell blocks connected by adjacent data transfer lines BL, normal operations of the circuit are possible even when the circuit operation margin is reduced by an amount of the difference of the delay times between the data transfer lines BL; and the circuit operation speed can be increased. Thereby, the read-out and the writing can be realized at speeds higher than those of the comparative example.

Further, it is possible to match the operation timing of the sense amplifier circuits 46 connected to adjacent data transfer lines BL; and as an entirety, it is possible to realize circuit operations having matched delay characteristics and matched skew. The fluctuation of the delay time between the data transfer lines BL also can be reduced; and disturbance of the pulse waveform due to the difference of the time constants also can be reduced.

In the case where the lengths (the lengths along the X axis direction) of the data transfer lines BL included in the first memory cell block 1a and the second memory cell block 1b are substantially equal, the interconnect delay can be smaller than that of the comparative example by an amount of (R1C1)×ΔR or more; and a charge/discharge time of the interconnects can be reduced further. Thereby, normal operations of the circuit are possible even when the circuit operation margin is reduced; and the speed of the circuit operations can be increased. Thereby, the read-out and the writing can be realized at speeds higher than those of the comparative example.

In the semiconductor memory device 511 according to this example, the difference of the resistance from the sense amplifier circuit 46 to the memory cell unit 4 most distal to the sense amplifier circuit 46 can be reduced even in the case where, for example, the difference of the current amount flowing in the data transfer line BL affects the threshold voltage determination read-out, and this structure is advantageous because the threshold voltage determination can be performed stably due to reducing the resistance variations of data transfer lines.

That is, in the case of the comparative example in which the interconnect rerouting of the data transfer lines BL is not performed, the interconnect resistance of the low resistance interconnect L1 is (R1+R2) as described above while the interconnect resistance of the high resistance interconnect L2 is (R1+R2)×(1+ΔR). Thus, in the comparative example, a difference of the interconnect resistances between the low resistance interconnect L1 and the high resistance interconnect L2 occurs; and a difference of the amount of flowing current occurs.

Conversely, in the semiconductor memory device 511 according to this example, the time constant of the interconnect delay is {R1C1×(1+ΔR)+R2C2} or {R1C1+R2C2×(1+ΔR)} as described above; and the difference of the time constants between adjacent data transfer lines BL is (R1C1−R2C2)×ΔR.

In the case where the lengths of the data transfer lines BL of the first memory cell block 1a and the second memory cell block 1b are substantially equal, the difference of the time constants recited above of (R1C1−R2C2)×ΔR can be substantially zero.

Thereby, in the cases where the read-out is performed simultaneously and the writing is performed simultaneously on the memory cells MC connected to the adjacent data transfer lines BL, the circuit operation margin can be reduced by an amount of the difference of the interconnect resistances between the data transfer lines BL; and, therefore, the speed of the circuit operations can be increased. Also, the difference of the current due to the difference of the interconnect resistances can be reduced by reducing the difference of the interconnect resistances; and the difference of the threshold voltages can be detected with better precision. Thereby, the read-out and the writing can be realized at high speeds.

Moreover, in the case where the lengths of the data transfer lines BL included in the first and second memory cell blocks 1a and 1b are substantially equal, the interconnect resistance can be smaller than that of the comparative example by an amount of R1×ΔR or more; the interconnect resistance can be reduced further; and the current of the memory cells MC can be increased.

Second Example

Figure 11:
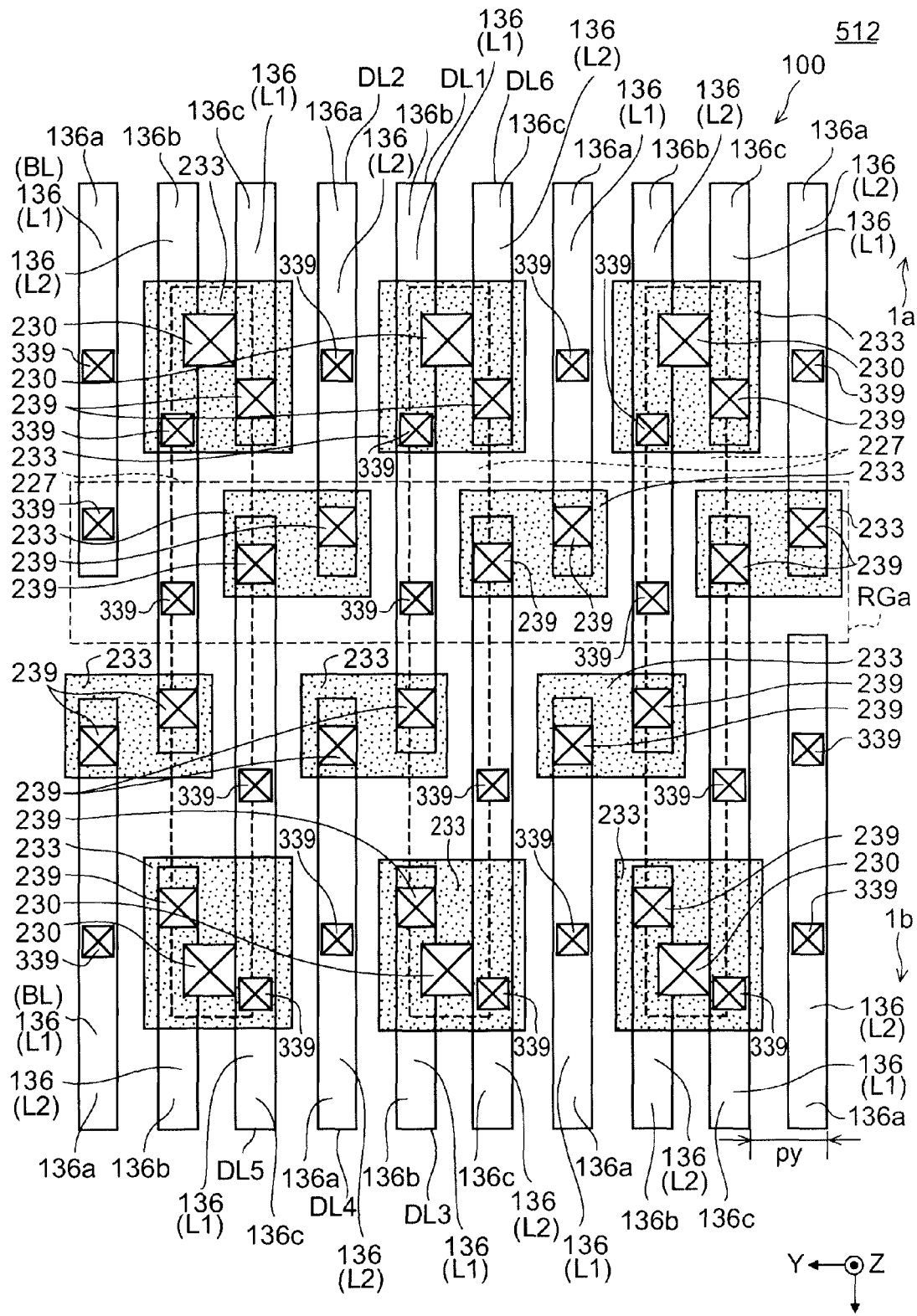
FIG. 11 is a schematic plan view illustrating the configuration of a semiconductor memory device of a second example.

FIG. 11 is a schematic plan view illustrating the configuration of a semiconductor memory device of a second example.

Namely, FIG. 11 illustrates the configuration of the data transfer line rerouting unit 100 provided in the semiconductor memory device 512 of the second example according to the first embodiment. The configuration of the semiconductor memory device 512 other than the data transfer line rerouting unit 100 is similar to that of the semiconductor memory device 511 of the first example, and a description is therefore omitted.

In a region RGa of the data transfer line rerouting unit 100 of the semiconductor memory device 512 as illustrated in FIG. 11, one contact set is formed of two first reroute contacts 239 and one contact lithography supplemental pattern 339 (not actually made through to contact). In one contact set, the two first reroute contacts 239 and the one contact lithography supplemental pattern 339 (not actually made through to contact) are disposed diagonally in the X-Y plane. Such a contact set is multiply disposed repeatedly along the Y axis direction. In other words, the two first reroute contacts 239 and the one contact lithography supplemental pattern 339 (not actually made through to contact) are repeatedly disposed in a staggered configuration (a zigzag configuration) along the Y axis direction.

The contact lithography supplemental pattern 339 (not actually made through to contact) is disposed to increase the regularity of the contacts in the X-Y plane. The contact lithography supplemental pattern 339 (not actually made through to contact) is formed, for example, smaller than the size of the first reroute contact 239 by an amount in the range of 3 nm to 30 nm. As a result, a portion of the contact lithography supplemental pattern 339 (not actually made through to contact) is not actually made into a contact hole and does not perform an electrical connection between the conductive layers.

As illustrated in FIG. 11, the first data transfer line DL1 is electrically connected to the fourth data transfer line DL4 via the first reroute contact 239 and the first reroute interconnect 233.

For example, the second data transfer line DL2 is electrically connected to the fifth data transfer line DL5 via the first reroute contact 239 and the first reroute interconnect 233. For example, the third data transfer line DL3 is electrically connected to the sixth data transfer line DL6 via the first reroute contact 239, the first reroute interconnect 233, and the second reroute interconnect 227.

Thereby, in the semiconductor memory device 512 as well, the fluctuation of the electrical resistance of the interconnects can be compensated; the interconnect delay can be suppressed; and the operating speed and the reliability can be improved.

The contacts of the data transfer lines BL in the memory cell blocks also may include the periodically disposed three contacts, i.e., the two first reroute contacts 239 and the one contact lithography supplemental pattern 339 (not actually made through to contact). Thereby, the data transfer line rerouting unit 100 can be formed with the same lithography conditions as the memory cell blocks; and the process margin can be increased even more.

Third Example

Figure 12:
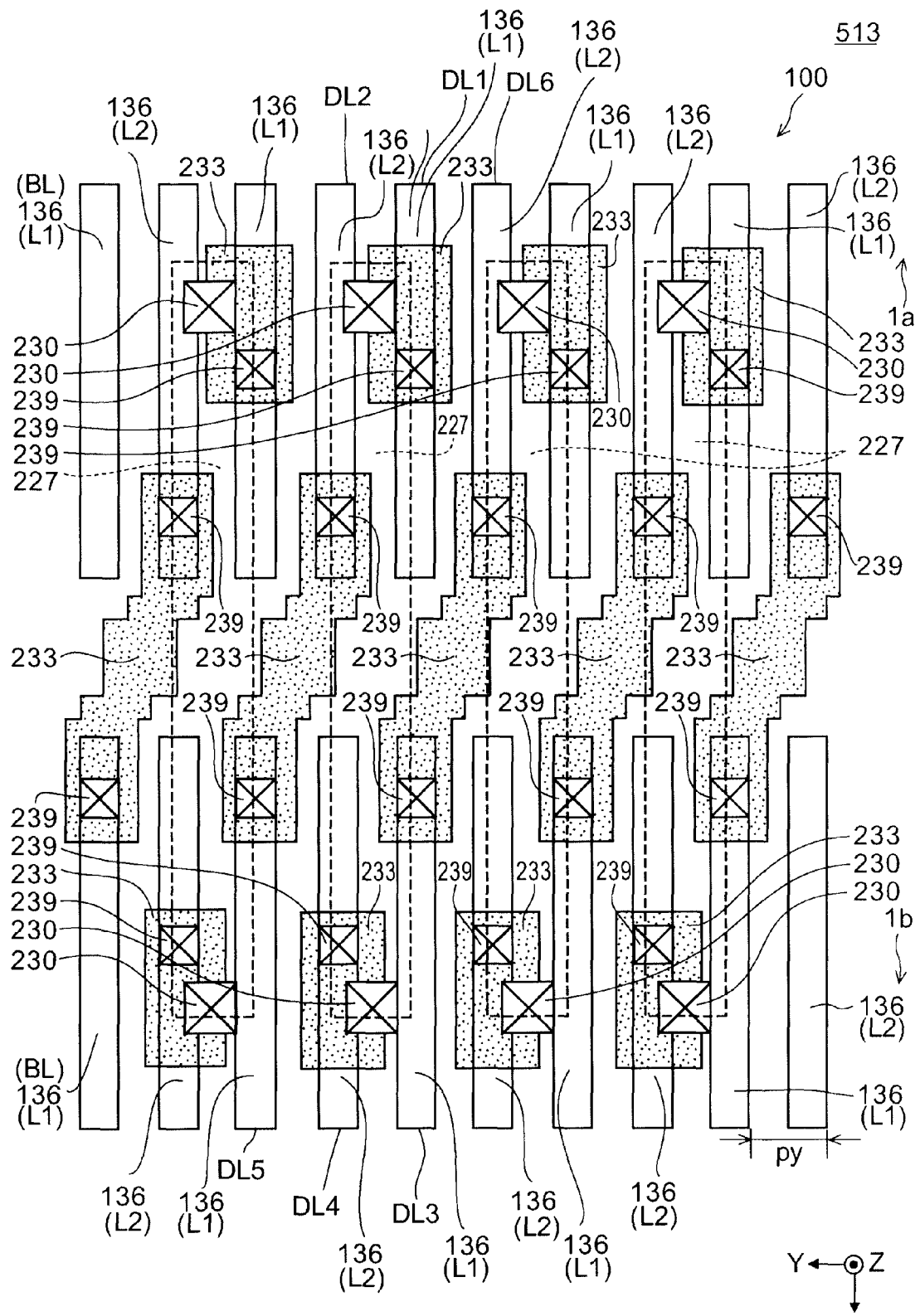
FIG. 12 is a schematic plan view illustrating the configuration of a semiconductor memory device of a third example.

FIG. 12 is a schematic plan view illustrating the configuration of a semiconductor memory device of a third example.

Namely, FIG. 12 illustrates the configuration of the data transfer line rerouting unit 100 provided in the semiconductor memory device 513 of the third example according to the first embodiment. The configuration of the semiconductor memory device 513 other than the data transfer line rerouting unit 100 is similar to that of the semiconductor memory device 511 of the first example, and a description is therefore omitted.

In the semiconductor memory device 513 as illustrated in FIG. 12, the dividing position of the data transfer lines 136 (the position of the end portions of the data transfer lines 136 in the X axis direction) is aligned between the low resistance interconnect L1 and the high resistance interconnect L2.

As illustrated in FIG. 12, for example, the first data transfer line DL1 is electrically connected to the fourth data transfer line DL4 via the first reroute contact 239, the first reroute interconnect 233, and the second reroute interconnect 227.

The second data transfer line DL2 is electrically connected to the fifth data transfer line DL5 via the first reroute contact 239 and the first reroute interconnect 233. The third data transfer line DL3 is electrically connected to the sixth data transfer line DL6 via the first reroute contact 239 and the first reroute interconnect 233.

Thereby, in the semiconductor memory device 513 as well, the fluctuation of the electrical resistance of the interconnects can be compensated; the interconnect delay can be suppressed; and the operating speed and the reliability can be improved.

Thus, according to the semiconductor memory device 510 (and the semiconductor memory devices 511 to 513 according to the first to third examples) according to this embodiment, the problems of the interconnect delay increasing and the read-out speed decreasing during the read-out of the memory cells MC can be mitigated.

In a structure in which the sense amplifier circuit 46 and the data transfer line BL (the data transfer line 136) are connected in series to the memory cell unit 4, the current flowing in the memory cells MC decreases as the interconnect resistance increases. Therefore, the difference between the cell current in the cut off state and the cell current in the conducting state decreases; it becomes difficult to discriminate between the states of the memory cells MC; and the read-out margin decreases. However, according to this embodiment, the minimum current flowing in the memory cells MC can be greater than that of the comparative example; and the read-out margin can be increased even more.

Particularly in a NAND flash memory, an interconnect having a length of, for example, not less than 2 mm may be used as the data transfer line BL to increase the proportion occupied by the memory cells MC; and the sense amplifier circuit 46 is electrically connected to the end of the data transfer line BL. In such a configuration, a delay due to the time constant of the data transfer line BL occurs between the memory cells MC connected to the data transfer line BL proximally to the sense amplifier circuit 46 and the memory cells MC connected at positions distal to the sense amplifier circuit 46. In the case where such memory cells MC are read at equivalent speeds, a read-out timing with an ample margin is set to be able to read the memory cells MC distal to the sense amplifier circuit 46. However, by applying this embodiment, the fluctuation of the time constants between the data transfer lines 136 can be reduced. Thereby, the read-out time margin of the memory cells MC can be greater than that of conventional art.

The amount of the voltage drop occurring in the data transfer line BL is proportional to the interconnect resistance. Accordingly, in the case where the width of the metal interconnect forming the data transfer line BL is uniformly narrow, problems of increased metal interconnect resistance and increased interconnect delays, electromigration, and stress induced migration easily occur. Conversely, by applying this embodiment, the problem of the current flowing in the memory cells MC decreasing as the interconnect resistance increases can be mitigated. Therefore, the read-out margin can be greater than that of conventional art. Further, the problems of increased metal interconnect resistance and increased interconnect delays, electromigration, and stress induced migration do not occur as easily as in the case where the width of the metal interconnect is uniformly narrow.

The semiconductor memory device 510 (and the semiconductor memory devices 511 to 513 according to the first to third examples) according to this embodiment have the following feature A.

Namely, the relative positions (e.g., the positions along the Y axis direction) can be mutually the same for the data transfer lines BL of the first memory cell block 1a and the data transfer lines BL of the second memory cell block 1b; and modifications to conventional art are unnecessary.

Therefore, it is sufficient only to shift the physical/logical address allocation between the memory cells MC by an odd number of bits. In other words, it is unnecessary to modify the voltage applied to the data transfer lines BL between the first and second memory cell blocks 1a and 1b; and a configuration similar to that of conventional art can be applied as-is.

Further, the relative relationship between the data transfer lines BL of the first memory cell block 1a and the data transfer lines BL of the second memory cell block 1b is the same relative relationship as that between the memory cells MC of the first memory cell block 1a and the memory cells MC of the second memory cell block 1b. Because the relative relationship of adjacent data transfer lines BL is the same as the relative relationship of adjacent cells, it is unnecessary to change the parameters against the interference and the disturb between the memory cells MC of the first memory cell block 1a and the second memory cell block 1b; the various design parameters can be handled equally with or without the rerouting; and the advantage of high design efficiency is provided.

Second Embodiment

Figure 13:
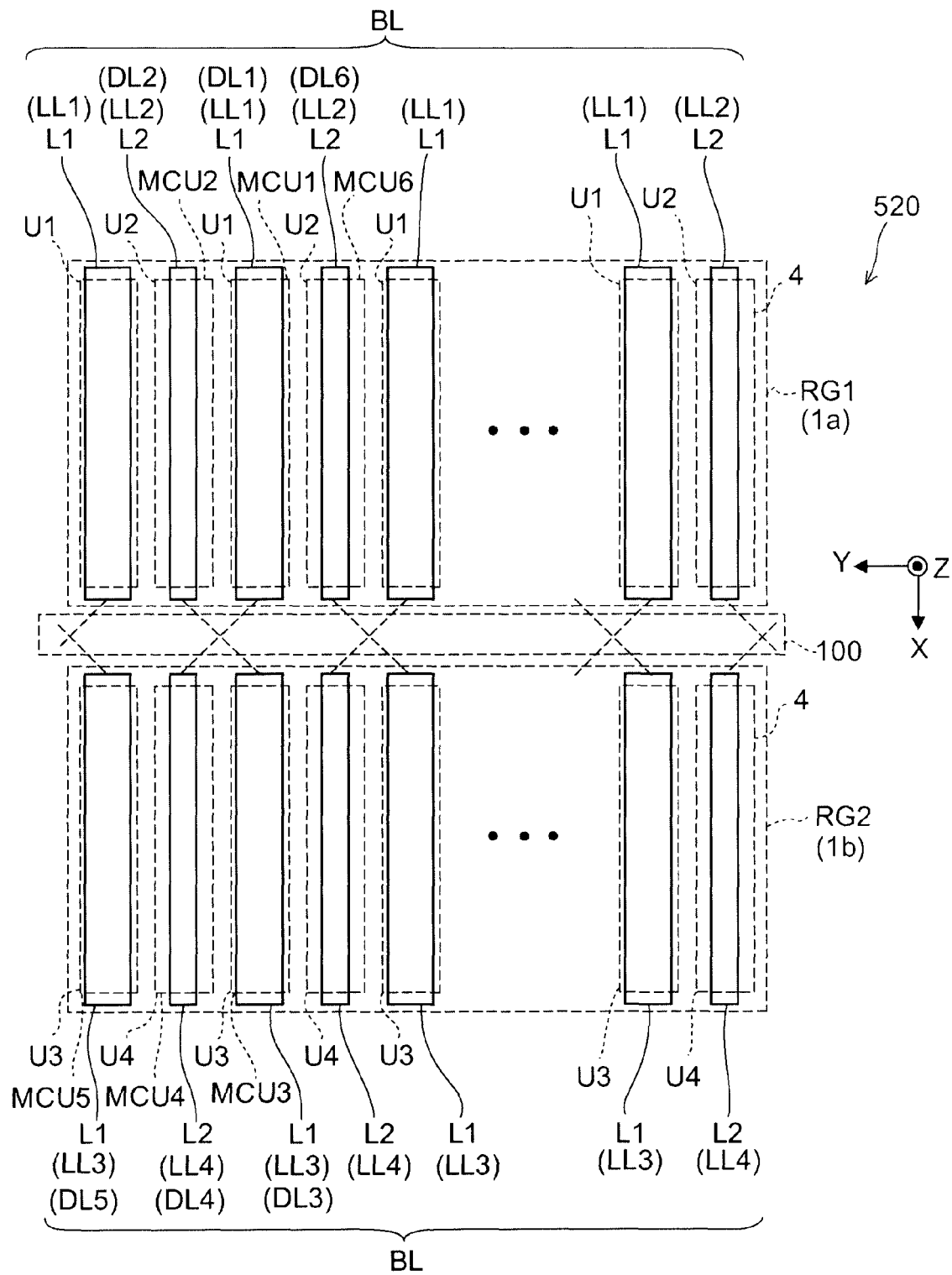
FIG. 13 is a schematic view illustrating the configuration of a semiconductor memory device according to a second embodiment.

FIG. 13 is a schematic view illustrating the configuration of a semiconductor memory device according to a second embodiment.

As illustrated in FIG. 13, the low resistance interconnect L1 (the first interconnect LL1 and the third interconnect LL3) and the high resistance interconnect L2 (the second interconnect LL2 and the fourth interconnect LL4) are provided also in the semiconductor memory device 520 according to this embodiment. In other words, the semiconductor memory device 520 also includes the first to fourth data transfer lines DL1 to DL4. The configuration of the rerouting of the first to fourth data transfer lines DL1 to DL4 in the semiconductor memory device 520 differs from that of the semiconductor memory device 510. Otherwise, the semiconductor memory device 520 is similar to the semiconductor memory device 510, and a description is therefore omitted.

In the semiconductor memory device 520, the third data transfer line DL3 is electrically connected to the second data transfer line DL2 between the first region RG1 (the first memory cell block 1a) and the second region RG2 (the second memory cell block 1b) while the fourth data transfer line DL4 is electrically connected to the first data transfer line DL1.

In such a configuration as well, the interconnect resistance can be uniform by connecting the low resistance interconnect L1 of the first region RG1 to the high resistance interconnect L2 of the second region RG2 and by connecting the high resistance interconnect L2 of the first region RG1 to the low resistance interconnect L1 of the second region RG2.

Thereby, effects similar to those described in regard to the first embodiment can be obtained. Namely, the fluctuation of the electrical resistance of the interconnects can be compensated; the interconnect delay can be suppressed; and the operating speed and the reliability can be improved.

The semiconductor memory device 520 according to the second embodiment exhibits effects similar to those of the first embodiment excluding the "feature A" described in regard to the first embodiment. Moreover, compared to the first embodiment, the rerouting of the data transfer lines BL in the semiconductor memory device 520 according to this embodiment can be performed without adding the odd number of the data transfer lines BL (the odd number of lines x the number of memory cell blocks). Thereby, the circuit surface area can be reduced.

Fourth Example

Figure 14:
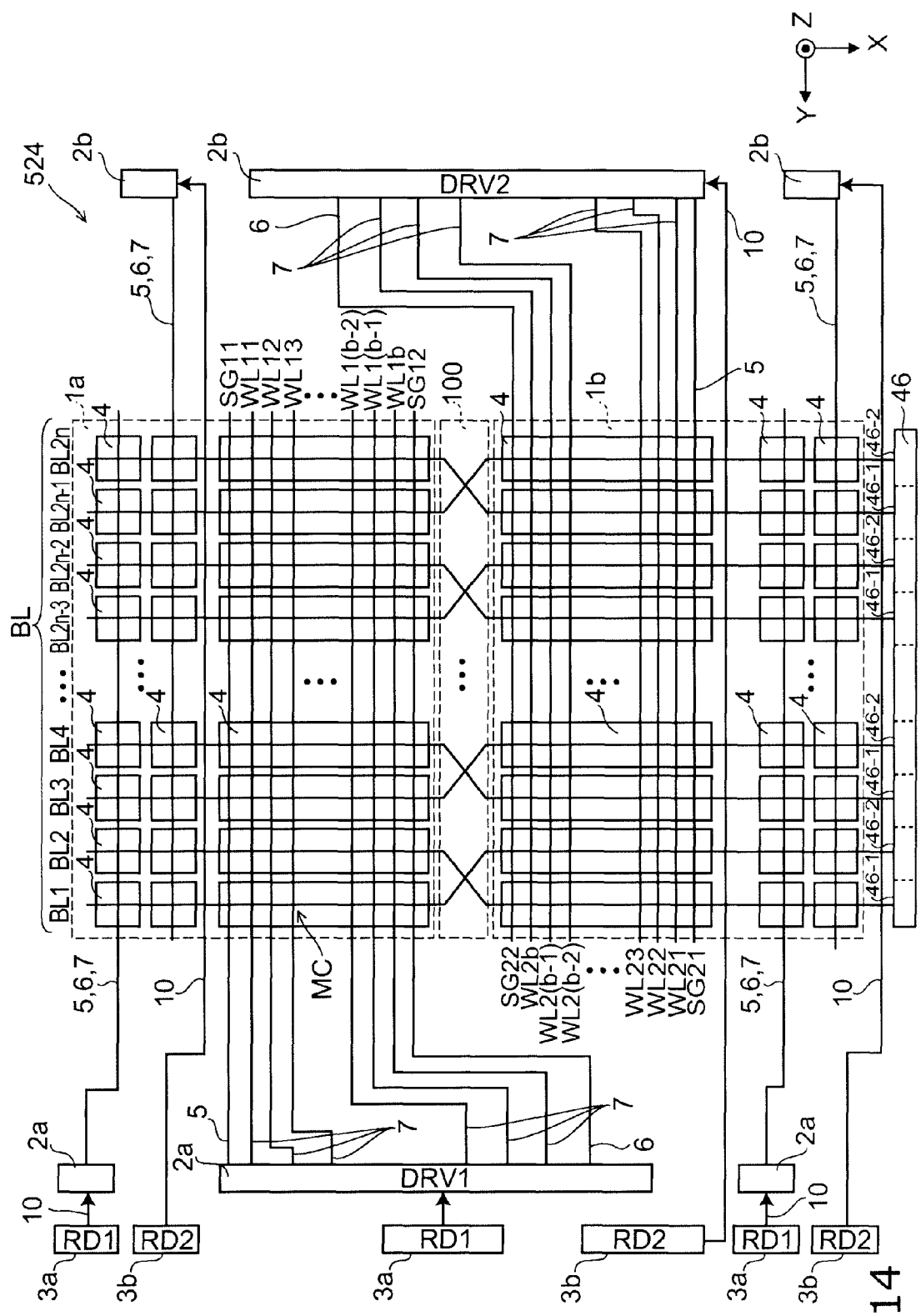
FIG. 14 is a schematic circuit diagram illustrating the configuration of a semiconductor memory device of a fourth example.

FIG. 14 is a schematic circuit diagram illustrating the configuration of a semiconductor memory device of a fourth example.

As illustrated in FIG. 14, the configuration of the data transfer line rerouting unit 100 of the semiconductor memory device 524 according to the fourth example of the second embodiment differs from that of the semiconductor memory device 511 according to the first example. Otherwise, the semiconductor memory device 524 is similar to the semiconductor memory device 511.

Namely, in the semiconductor memory device 524, the data transfer lines BL are rerouted by crossing two from each of the first and second memory cell blocks 1a and 1b.

Figure 15:
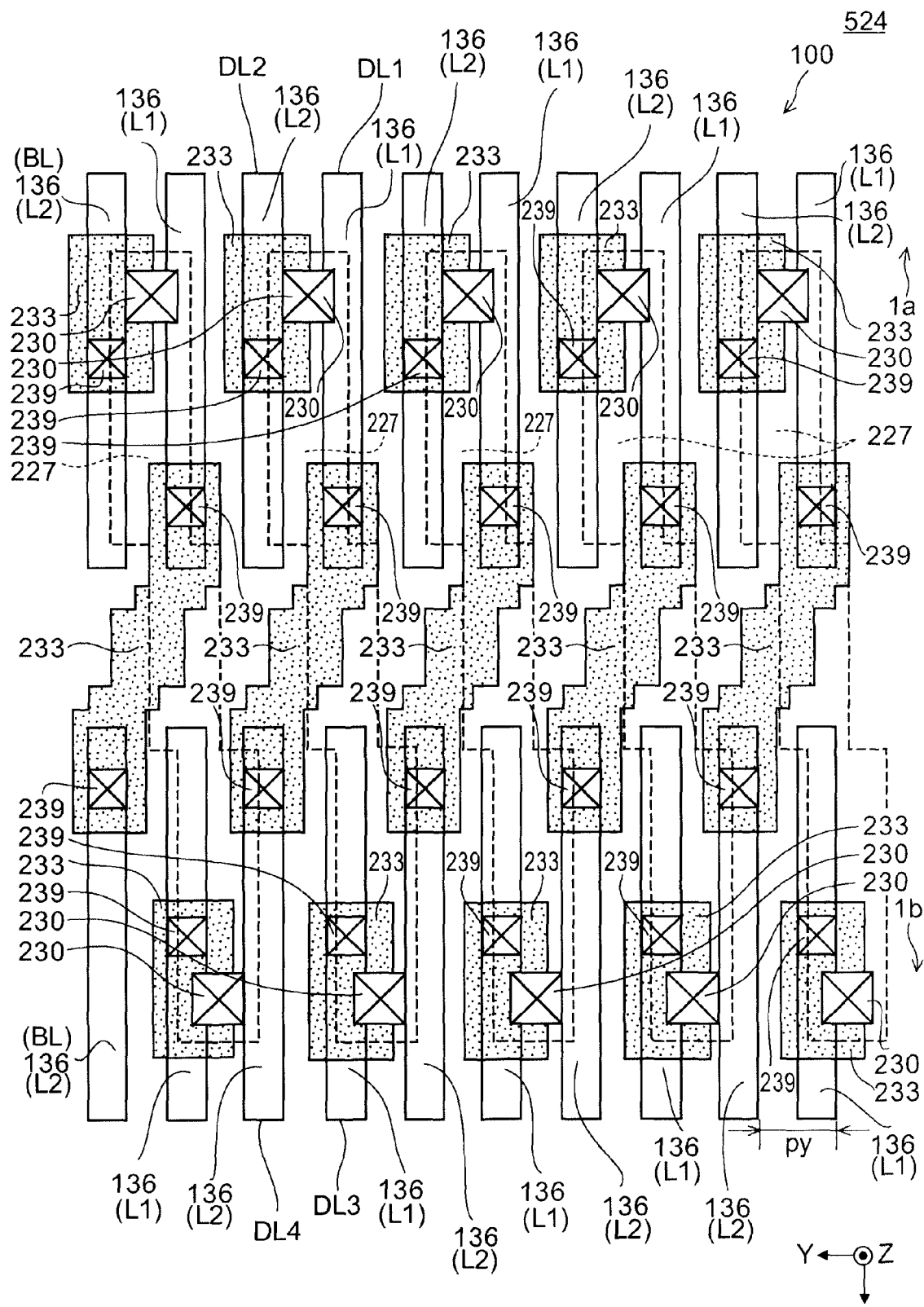
FIG. 15 is a schematic plan view illustrating the configuration of the semiconductor memory device of the fourth example.

FIG. 15 is a schematic plan view illustrating the configuration of the semiconductor memory device of the fourth example.

Namely, FIG. 15 illustrates the configuration of the data transfer line rerouting unit 100 provided in the semiconductor memory device 524 of the fourth example.

In the semiconductor memory device 524 as illustrated in FIG. 15, for example, the first data transfer line DL1 is electrically connected to the fourth data transfer line DL4 via the first reroute contact 239 and the first reroute interconnect 233.

The second data transfer line DL2 is electrically connected to the third data transfer line DL3 via the first reroute contact 239, the first reroute interconnect 233, and the second reroute interconnect 227.

Thereby, in the semiconductor memory device 524 as well, the fluctuation of the electrical resistance of the interconnects can be compensated; the interconnect delay can be suppressed; and the operating speed and the reliability can be improved.

The formation methods of the element-separating insulating film 124, the inter-layer insulating film 150, and the inter-layer insulating film 168 of any of the semiconductor memory devices according to the first and second embodiments recited above may include, for example, methods that implant oxygen ions into a deposited silicon film and methods that oxidize a deposit silicon film as well as, for example, methods that convert silicon into a silicon oxide film or a silicon nitride film.

Although a conductive film made of polycrystalline silicon is used as the floating gate 126 in the specific example recited above, an insulative charge storage layer may be used as the floating gate 126. The charge storage layer may include, for example, a single-layer film of one selected from the group consisting of SiN, SiON, $TiO_2$, $Al_2O_3$, tantalum oxide film, strontium titanate, barium titanate, and lead zirconium titanate or a stacked film including at least two selected from the group.

Although the p-type silicon substrate 121 is used as the semiconductor substrate in which the semiconductor memory device is formed in the specific examples recited above, the semiconductor substrate may include a p-type SOI substrate including an SOI (Silicon On Insulator) and a substrate including a p-type monocrystalline semiconductor layer including silicon such as a SiGe mixed crystal, a SiGeC mixed crystal, etc.

Although a configuration is described in the specific examples recited above in which an n-type FET is formed on the p-type silicon region 123, a configuration may be used in which a p-type FET is formed on an n-type silicon region. In such a case, it is sufficient for "n-type" recited above to be replaced with "p-type," "p-type" recited above to be replaced with "n-type," and the doping impurity types of As, P, and Sb to be replaced with In or B.

The floating gate 126 and the control gate 127 may include a Si semiconductor, a SiGe mixed crystal, or a SiGeC mixed crystal, a polycrystal of the same, or a stacked film of the same. The floating gate 126 and the control gate 127 may include amorphous Si, an amorphous SiGe mixed crystal, or an amorphous SiGeC mixed crystal, or a stacked film of the same.

A metal lining layer may be provided on the control gate 127 by depositing. Or, for example, a silicide layer may be formed and used as the metal lining layer by causing the control gate 127 to react with at least one selected from the group consisting of Ti, Co, Ni, Mo, Pd, and Pt.

The memory cell MC recited above may include a semiconductor memory cell transistor having the two values of "0" and "1;" or, a semiconductor memory cell transistor storing multiple bits of three values or more may be used. Greater effects can be obtained by applying this embodiment in the case where a multi-level semiconductor memory cell transistor is used because the spacings between the multiple threshold voltage distributions are narrow and the increase of the threshold voltage distributions due to capacitive coupling between adjacent memory cells; and problems easily occur such as program-disturbance. It is desirable for the number of threshold voltage distributions stored in one memory cell MC to be a power-of-two integer to simplify the decoding of the information data.

Although the sense amplifier circuit 46 is provided on the second memory cell block 1b side in the specific examples recited above, the sense amplifier circuits 46 may be provided on the first memory cell block 1a side and the second memory cell block 1b side with the functions thereof dispersed therebetween.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components included in semiconductor memory devices such as first to fourth interconnects, low resistance interconnects, high resistance interconnects, first to sixth data transfer lines, memory cells, memory cell units, memory cell blocks, first and second regions, first and second insulating regions, data transfer line rerouting units, reroute interconnects, reroute contacts, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor memory devices practicable by an appropriate design modification by one skilled in the art based on the semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the exemplary embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor memory device, comprising:
a first memory cell block;
a second memory cell block adjacent to the first memory cell block in a first direction; and
an interconnect rerouting unit provided between the first memory cell block and the second memory cell block,
the first memory cell block including:
a plurality of first cell units, each of the plurality of first cell units including a plurality of memory cells;
a plurality of second cell units, each of the plurality of second cell units including a plurality of memory cells;
a plurality of first interconnects; and
a plurality of second interconnects,
each of the plurality of first interconnects being aligned in the first direction and connected to one end of each of the first cell units respectively,
each of the plurality of second interconnects being aligned in the first direction in each space between the first interconnects and connected to one end of each of the second cell units respectively, the each of the plurality of second interconnects having at least one of a width of each of the plurality of second interconnects along a second direction perpendicular to the first direction being smaller than a width of each of the plurality of first interconnects along the second direction and a thickness of each of the plurality of second interconnects along a third direction perpendicular to the first direction and the second direction being smaller than a thickness of each of the plurality of first interconnects along the third direction, the second memory cell block including:
- a plurality of third cell units, each of the plurality of third cell units including a plurality of memory cells;
- a plurality of fourth cell units, each of plurality of fourth cell units including a plurality of memory cells;
- a plurality of third interconnects; and
- a plurality of fourth interconnects,
- each of the plurality of third interconnects being aligned in the first direction on a line extending from the first interconnect in the first direction and connected to one end of each of the third cell units respectively,
- each of the plurality of fourth interconnects being aligned in the first direction on a line extending from the second interconnect in the first direction and connected to one end of each of the fourth cell units respectively, each of the plurality of fourth interconnects having at least one of a width of each of the plurality of fourth interconnects along the second direction being smaller than a width of each of the plurality of third interconnects along the second direction and a thickness of each of the plurality of fourth interconnects along the third direction being smaller than a thickness of each of the plurality of third interconnects along the third direction, the interconnect rerouting unit electrically connecting one of the plurality of fourth interconnects to one of the plurality of first interconnects and electrically connecting one of the plurality of third interconnects to one of the plurality of second interconnects.

2. The device according to claim 1, wherein the plurality of first interconnects, the plurality of second interconnects, the plurality of third interconnects, and the plurality of fourth interconnects have reverse-tapered cross sections.

3. The device according to claim 2, wherein the plurality of first interconnects, the plurality of second interconnects, the plurality of third interconnects, and the plurality of fourth interconnects have a damascene structure including at least one selected from Cu and W.

4. The device according to claim 2, wherein the plurality of first interconnects, the plurality of second interconnects, the plurality of third interconnects, and the plurality of fourth interconnects are constructed by double patterning using a sidewall transfer process.

5. The device according to claim 1, further comprising:
- a plurality of first sense amplifier circuits provided on a side of the second memory cell block opposite to the first memory cell block; and
- a plurality of second sense amplifier circuits provided on the side of the second memory cell block opposite to the first memory cell block,
- each of the plurality of first sense amplifier circuits being connected to one end of each of the plurality of third interconnects respectively,
- each of the plurality of second sense amplifier circuits being connected to one end of each of the plurality of fourth interconnects respectively.

6. The device according to claim 1, wherein:
the plurality of first cell units is NAND memory cell units, the plurality of memory cells included in the plurality of first cell units having a NAND connection;
the plurality of second cell units is NAND memory cell units, the plurality of memory cells included in the plurality of second cell units having a NAND connection;
the plurality of third cell units is NAND memory cell units, the plurality of memory cells included in the plurality of third cell units having a NAND connection; and
the plurality of fourth cell units is NAND memory cell units, the plurality of memory cells included in the plurality of fourth cell units having a NAND connection.

7. The device according to claim 1, wherein
each of the plurality of memory cells included in the plurality of first cell units includes:
- a semiconductor layer of a second conductivity type including a first diffusion region of a first conductivity type and a second diffusion region of the first conductivity type;
- a memory film provided on the semiconductor layer between the first diffusion region and the second diffusion region; and
- a control gate provided on the memory film,
the interconnect rerouting unit includes a first reroute interconnect layer,
a distance along the third direction between the first reroute interconnect layer and the semiconductor layer is different from a distance along the third direction between the plurality of first interconnects and the semiconductor layer, and
the one of the plurality of fourth interconnects is electrically connected to the one of the plurality of first interconnects via the first reroute interconnect layer.

8. The device according to claim 1, wherein
each of the plurality of memory cells included in the plurality of first cell units includes:
- a semiconductor layer of a second conductivity type including a first diffusion region of a first conductivity type and a second diffusion region of the first conductivity type;
- a memory film provided on the semiconductor layer between the first diffusion region and the second diffusion region; and
- a control gate provided on the memory film,
the interconnect rerouting unit includes a first reroute interconnect layer,
a distance along the third direction between the first reroute interconnect layer and the semiconductor layer is smaller than a distance along the third direction between the plurality of first interconnects and the semiconductor layer, and greater than a distance along the third direction between the control gate and the semiconductor layer.

9. The device according to claim 8, wherein a width of the first reroute interconnect layer along the second direction is not less than twice a width of the first interconnect along the second direction.

10. The device according to claim 1, wherein
each of the plurality of memory cells included in the plurality of first cell units includes:
- a semiconductor layer of a second conductivity type including a first diffusion region of a first conductivity type and a second diffusion region of the first conductivity type;
- a memory film provided on the semiconductor layer between the first diffusion region and the second diffusion region; and
- a control gate provided on the memory film,
the interconnect rerouting unit includes a second reroute interconnect layer,
a distance along the third direction between the second reroute interconnect layer and the semiconductor layer is substantially equal to a distance along the third direction between the control gate and the semiconductor layer, and the one of the plurality of third interconnects is electrically connected to the one of the plurality of second interconnects via the second reroute interconnect layer.

11. The device according to claim 10, wherein a width of the first reroute interconnect layer along the second direction is not less than twice a width of the first interconnect along the second direction.

12. The device according to claim 10, wherein:
the interconnect rerouting unit further includes a plurality of first reroute interconnect layers, a plurality of first reroute contacts and a plurality of second reroute contacts;
a distance along the third direction between the semiconductor layer and each of the plurality of first reroute interconnect layers is smaller than a distance along the third direction between the plurality of first interconnects and the semiconductor layer and greater than a distance along the third direction between the control gate and the semiconductor layer;
the one of the plurality of fourth interconnects is electrically connected to the one of the plurality of first interconnects via one of the plurality of first reroute interconnect layers;
the one of the plurality of third interconnects is electrically connected to the one of the plurality of second interconnects via the second reroute interconnect layer;
one of the plurality of first reroute contacts electrically connects the one of the plurality of fourth interconnects to the one of the plurality of first reroute interconnect layers;
one other of the plurality of first reroute contacts electrically connects the one of the plurality of first interconnects to the one of the plurality of first reroute interconnect layers;
one of the plurality of second reroute contacts electrically connects one other of the plurality of first reroute interconnect layers to the second reroute interconnect layer; and
one other of the plurality of second reroute contacts electrically connects still one other of the plurality of first reroute interconnect layers to the second reroute interconnect layer.

13. The device according to claim 12, wherein a diameter of the second reroute contact is not less than 1.2 times a diameter of the first reroute contact.

14. The device according to claim 1, wherein a crystal grain size of a metal included in the plurality of second interconnects is smaller than a crystal grain size of a metal included in the plurality of first interconnects.

15. The device according to claim 1, wherein:
a second data transfer line is adjacent to a first data transfer line in the second direction, the second data transfer line being one of the second interconnects, the first data transfer line being one of the first interconnects;
a third data transfer line is disposed on a line extending from the first data transfer line in the first direction, the third data transfer line being one of the third interconnects;
a fourth data transfer line is disposed on a line extending from the second data transfer line in the first direction, the fourth data transfer line being one of the fourth interconnects; and the interconnect rerouting unit electrically connects the fourth data transfer line to the first data transfer line.

16. The device according to claim 15, wherein the interconnect rerouting unit electrically connects the third data transfer line to the second data transfer line.

17. The device according to claim 15, wherein:
a fifth data transfer line is adjacent to the fourth data transfer line on a side of the fourth data transfer line opposite to the third data transfer line in the second direction, the fifth data transfer line being one other of the third interconnects;
a sixth data transfer line is adjacent to the first data transfer line on a side of the first data transfer line opposite to the second data transfer line in the second direction, the sixth data transfer line being one other of the second interconnects; and
the interconnect rerouting unit electrically connects the third data transfer line to the sixth data transfer line while electrically connecting the second data transfer line to the fifth data transfer line.

18. The device according to claim 15, wherein:
a width of the third data transfer line along the second direction is substantially equal to a width of the first data transfer line along the second direction;
a thickness of the third data transfer line along the third direction is substantially equal to a thickness of the first data transfer line along the third direction;
a width of the fourth data transfer line along the second direction is substantially equal to a width of the second data transfer line along the second direction;
a thickness of the fourth data transfer line along the third direction is substantially equal to a thickness of the third data transfer line along the third direction.

19. The device according to claim 15, wherein:
a sixth data transfer line is adjacent to the first data transfer line on a side of the first data transfer line opposite to the second data transfer line, the sixth data transfer line being one other of the second interconnects;
an absolute value of a difference between a width of the first data transfer line along the second direction and a width of the second data transfer line along the second direction is greater than an absolute value of a difference between a width of a first insulating region along the second direction from the first data transfer line to the second data transfer line and a width of a second insulating region along the second direction from the first data transfer line to the sixth data transfer line.

20. The device according to claim 15, wherein:
a number of the memory cells included in one of the first cell units connected to the first data transfer line is equal to a number of the memory cells included in one of the second cell units connected to the second data transfer line;
a number of the memory cells included in one of the third cell units connected to the third data transfer line is equal to a number of the memory cells included in one of the fourth cell units connected to the fourth data transfer line; and
the absolute value of $(NA-NB)/(NA+NB)$ is not more than 0.1, where NA is the number of the memory cells included in the first cell unit and NB is the number of the memory cells included in the third cell unit.

* * * * *